US012787557B2

(12) United States Patent
Song et al.

(10) Patent No.: US 12,787,557 B2
(45) Date of Patent: Nov. 3, 2026

(54) DISPLAY APPARATUS COMPRISING A DEPOSITION BLOCKING LAYER DISPOSED IN A TRANSMISSIVE AREA

(71) Applicant: LG Display Co., Ltd., Seoul (KR)

(72) Inventors: Mingeun Song, Goyang-si (KR); SeokHyun Kim, Seoul (KR); Sangwon Jung, Seoul (KR); KwanSoo Kim, Seoul (KR); JongWoo Park, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 327 days.

(21) Appl. No.: 18/524,404

(22) Filed: Nov. 30, 2023

(65) Prior Publication Data

US 2024/0224612 A1 Jul. 4, 2024

(30) Foreign Application Priority Data

Dec. 29, 2022 (KR) ........................ 10-2022-0188328

(51) Int. Cl.
*H10K 59/122* (2023.01)

(52) U.S. Cl.
CPC .................................. *H10K 59/122* (2023.02)

(58) Field of Classification Search
CPC ...... H10K 59/10; H10K 59/12; H10K 59/121; H10K 59/122; H10K 59/40; H10K 59/60; H10K 59/65; H10K 50/81
See application file for complete search history.

(56) References Cited

U.S. PATENT DOCUMENTS

2018/0033847 A1* 2/2018 Kim ................... H10D 86/0231
2020/0258947 A1* 8/2020 Chung ............. H10K 59/80522
2020/0393936 A1* 12/2020 Bok ...................... G06F 3/0443
2021/0191552 A1 6/2021 Bok et al.

(Continued)

FOREIGN PATENT DOCUMENTS

CN 112928147 A 6/2021
CN 113497203 A 10/2021

(Continued)

OTHER PUBLICATIONS

Intellectual Property Office of the United Kingdom, Search Report, United Kingdom Patent Application No. GB2319563.9, Jun. 21, 2024, four pages.

(Continued)

*Primary Examiner* — Khiem D Nguyen
(74) *Attorney, Agent, or Firm* — Fenwick & West LLP

(57) ABSTRACT

A display apparatus includes a substrate including a display area including a first area and a second area surrounding the first area, the first area includes an emission area and a transmissive area. The display apparatus further includes a planarization layer disposed on the substrate in the display area. The display apparatus further includes a plurality of light emitting elements disposed on the planarization layer and including an anode, a light emitting layer, and a cathode. The display apparatus further includes a bank disposed to cover a portion of an end portion of the anode in the emission area. The display apparatus further includes a deposition blocking layer disposed on the planarization layer in the transmissive area. The deposition blocking layer is spaced apart from the bank.

15 Claims, 16 Drawing Sheets

(56) References Cited

U.S. PATENT DOCUMENTS

| | | | |
|---|---|---|---|
| 2023/0092986 A1 | 3/2023 | Rieutort-Louis et al. | |
| 2024/0032344 A1* | 1/2024 | Jin | H10K 59/122 |

FOREIGN PATENT DOCUMENTS

| | | | |
|---|---|---|---|
| EP | 4161236 A1 | 4/2023 |
| EP | 4174834 A1 | 5/2023 |
| KR | 10-2020-0085638 A | 7/2020 |
| KR | 10-2021-0082316 A | 7/2021 |
| WO | WO 2022/170666 A1 | 8/2022 |

OTHER PUBLICATIONS

Intellectual Property Office of the United Kingdom, Examination Report, United Kingdom Patent Application No. GB2319563.9, Oct. 1, 2025, three pages.

* cited by examiner

DISPLAY APPARATUS COMPRISING A DEPOSITION BLOCKING LAYER DISPOSED IN A TRANSMISSIVE AREA

CROSS-REFERENCE TO RELATED APPLICATION

This application claims the benefit of Republic of Korea Patent Application No. 10-2022-0188328 filed on Dec. 29, 2022, which is hereby incorporated by reference in its entirety.

BACKGROUND

Field

The present disclosure relates to a display apparatus, and more particularly, to provide a display apparatus capable of preventing delamination of a layer stacked in a transmissive area where an optical electronic device is disposed.

Discussion of the Related Art

The field of display apparatuses for visually displaying an electrical information signal has rapidly advanced. The development of various display apparatuses having excellent performance in terms of reducing thickness, being lightweight, and having low power consumption, is being conducted correspondingly.

Representative display apparatuses may include a liquid crystal display (LCD), a field emission display (FED), an electro-wetting display (EWD), an organic light emitting display (OLED), and the like.

An electroluminescent display apparatus represented by an organic light emitting display is a self-emitting display apparatus and can be manufactured to be light and thin since it does not require a separate light source, unlike a liquid crystal display having a separate light source. In addition, the electroluminescent display apparatus has advantages in terms of power consumption due to a low voltage driving, and is excellent in terms of color implementation, response speed, viewing angle, and contrast ratio (CR). Therefore, electroluminescent display apparatuses are expected to be utilized in various fields.

Recently, multimedia functions of mobile terminals have improved. For example, display apparatuses in which an optical electronic device such as a camera or a sensor is built in a front surface thereof have been developed. However, a camera or sensor disposed on the front surface of a display apparatus may limit screen design. In order to reduce space occupied by the camera or sensor on the front surface of the display apparatus, a design including a notch or punch hole may be applied, but a screen size is still limited, so it is difficult to implement a full-screen display. A notch or punch hole may be a part of the display apparatus where the screen is not formed, and the camera or sensor is placed. A notch may have a shape in which some of the boundary lines of the display area are recessed inward (or a shape in which a bezel protrudes). A punch hole may not be connected to a bezel and may be shaped like a hole inside the display area.

In order to implement the full-screen display, a method of providing an area in which low-resolution pixels are disposed on a screen of a display apparatus and disposing a camera and/or various sensors in the area where the low-resolution pixels are disposed has been proposed.

SUMMARY

An aspect of the present disclosure is to provide a display apparatus having an improved transmittance in a transmissive area where an optical electronic device such as a camera or a sensor is disposed.

Another aspect of the present disclosure is to provide a display apparatus capable of preventing delamination of a layer stacked in a transmissive area.

Objects of the present disclosure are not limited to the above-mentioned objects, and other objects which are not mentioned above can be clearly understood by those skilled in the art from the following description.

A display apparatus according to an example of the present disclosure includes a substrate including a display area including a first area and a second area surrounding the first area, wherein the first area includes an emission area and a transmissive area: a planarization layer disposed on the substrate in the display area: a plurality of light emitting elements disposed on the planarization layer and including an anode, a light emitting layer, and a cathode: a bank disposed to cover a portion of an end portion of the anode in the emission area: and a deposition blocking layer disposed on the planarization layer in the transmissive area, wherein the deposition blocking layer is spaced apart from the bank.

Other detailed matters of the examples are included in the detailed description and the drawings.

In the display apparatus according to an example of the present disclosure, by disposing a camera or sensor at a lower end of a light emitting element or touch electrode in a display area, a display or touch electrode on an upper portion thereof cannot be disconnected.

In the display apparatus according to an example of the present disclosure, a deposition blocking layer is disposed in an area overlapping an area where a camera or a sensor is disposed, and then, a metal electrode is deposited, so that a transmissive area where an opaque component such as the metal electrode is not disposed may be positioned over the deposition blocking layer. Accordingly, light transmittance in the area where a camera or sensor is disposed is improved, so that visibility of the display apparatus can be improved.

A display apparatus according to an example of the present disclosure provides a structure in which a deposition blocking layer is prevented from being formed along a side surface of a bank disposed in an emission area while the deposition blocking layer is disposed on a flat surface in a transmissive area, so that film delamination defects due to an arrangement of the deposition blocking layer can be prevented.

The effects according to the present disclosure are not limited to the contents exemplified above, and more various effects are included in the present specification.

DETAILED DESCRIPTION

Figure 1A:
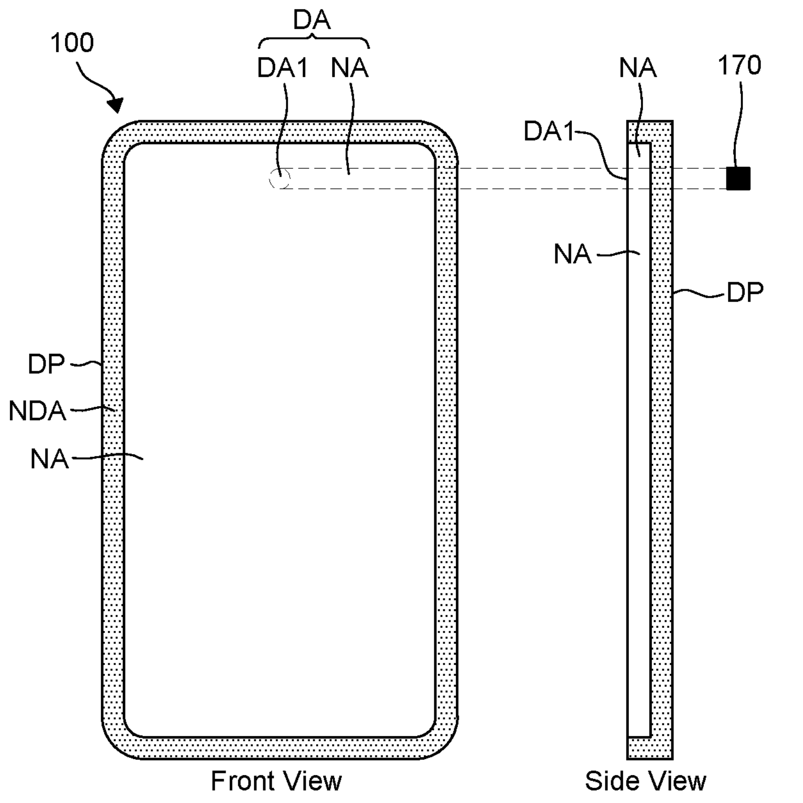
FIGS. 1A to 1D are schematic plan views of a display apparatus according to an example of the present disclosure.

Advantages and characteristics of the present disclosure and a method of achieving the advantages and characteristics will be clear by referring to examples described below in detail together with the accompanying drawings. However, the present disclosure is not limited to the examples disclosed herein but will be implemented in various forms. The examples are provided by way of example only so that those skilled in the art can fully understand the disclosures of the present disclosure and the scope of the present disclosure.

The shapes, sizes, ratios, angles, numbers, and the like illustrated in the accompanying drawings for describing the examples of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as “including”, “having”, and “comprising” used herein are generally intended to allow other components to be added unless the terms are used with the term “only”. Any references to singular may include plural unless expressly stated otherwise.

Components are interpreted to include an ordinary error range even if not expressly stated.

When the position relation between two parts is described using the terms such as “on”, “above”, “below”, and “next”, one or more parts may be positioned between the two parts unless the terms are used with the term “immediately” or “directly” is not used.

When an element or layer is referred to as being “on” another element or layer, it may be directly on the other element or layer, or intervening elements or layers may be present therebetween.

Although the terms “first”, “second”, and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification. A size and a thickness of each component illustrated in the drawings are illustrated for convenience of explanation, and are not limited to the size and the thickness of the component illustrated in the examples of the present disclosure.

The features of various embodiments of the present disclosure can be partially or entirely coupled to or combined with each other and can be interlocked and operated in technically various ways, and respective embodiments can be carried out independently of or in association with each other.

FIGS. 1A to 1D are schematic plan views of a display apparatus according to an example of the present disclosure.

Referring to FIGS. 1A to 1D, a display apparatus 100 according to an example of the present disclosure may include a display panel DP displaying an image and one or more optical electronic devices 170, 170*a*, and 170*b*. The optical electronic devices 170, 170*a*, and 170*b* may include a light receiving device that receives light, such as a camera or a sensor.

The display panel DP is a panel for displaying an image to a user.

The display panel DP may include a display element for displaying an image, a driving element for driving the display element, and lines for transmitting various signals to the display element and the driving element. The display element may be defined differently depending on a type of display panel DP. For example, when the display panel DP is an organic light emitting display panel, the display element may be an organic light emitting element including an anode, a light emitting layer, and a cathode. For example, when the display panel DP is a liquid crystal display panel, the display element may be a liquid crystal display element. Also, the display apparatus 100 according to an example of the present disclosure may be a flexible display apparatus.

Hereinafter, it is assumed that the display panel DP is an organic light emitting display panel, but the display panel DP is not limited to the organic light emitting display panel.

Meanwhile, the display panel DP may be configured to include a substrate and a plurality of insulating layers, a transistor layer, and a light emitting element layer on the substrate. The display panel DP may include a plurality of sub-pixels to display an image and various signal lines for driving the plurality of sub-pixels. The signal lines may include a plurality of data lines, a plurality of gate lines, a plurality of power lines, and the like. In this case, each of the plurality of sub-pixels may include a transistor located on the transistor layer and a light emitting element located on the light emitting element layer.

The display panel DP may include a display area DA where an image is displayed and a non-display area NDA where an image is not displayed.

The plurality of sub-pixels constituting a plurality of pixels and circuits for driving the plurality of sub-pixels may be disposed in the display area DA. The display area DA comprises at least the plurality of sub-pixels, and the display element may be disposed in each of the plurality of sub-pixels, and the plurality of sub-pixels may constitute the pixel. For example, the organic light emitting element including the anode, the light emitting layer, and the cathode may be disposed in each of the plurality of sub-pixels, but the present disclosure is not limited thereto. In addition, the circuit for driving the plurality of sub-pixels may include driving elements and lines. For example, the circuit may include a thin film transistor, a storage capacitor, gate lines, data lines, and the like, but the present disclosure is not limited thereto.

The non-display area NDA may be bent and not visible from the front or may be covered by a case (not illustrated), and is also referred to as a bezel area.

In the non-display area NDA, various lines and circuits for driving the organic light emitting elements of the display area DA may be disposed. For example, driver ICs such as a gate driver IC and a data driver IC, a gate in panel (GIP) line, and link lines for transmitting signals to the plurality of sub-pixels and circuits of the display area DA, and the like may be disposed in the non-display area NDA, but the present disclosure is not limited thereto.

FIGS. 1A to 1D illustrate that the non-display area NDA surrounds the display area DA having a rectangular shape, but shapes and arrangements of the display area DA and the non-display area NDA are not limited to the examples illustrated in FIGS. 1A to 1D. That is, the display area DA and the non-display area NDA may have shapes suitable for a design of an electronic device in which the display apparatus 100 is mounted. For example, an exemplary shape of the display area DA may be a pentagonal shape, a hexagonal shape, a circular shape, or an elliptical shape.

The display apparatus 100 may further include various additional elements for generating various signals or driving the pixels in the display area DA. The additional elements for driving the pixels may include an inverter circuit, a multiplexer, an electrostatic discharge (ESD) circuit, and the like. The display apparatus 100 may also include additional elements related to functions other than pixel driving. For example, the display apparatus 100 may further include additional elements for providing a touch sensing function, a user authentication function (e.g., fingerprint recognition), a multi-level pressure sensing function, a tactile feedback function, and the like. The additional elements aforementioned may be located in the non-display area NDA and/or an external circuit connected to a connection interface.

Referring to FIGS. 1A to 1D, in the display apparatus 100 according to examples of the present disclosure, the one or more optical electronic devices 170, 170*a*, and 170*b* are electronic components located under (on an opposite side of a viewing surface) the display panel DP.

Light may enter a front surface (the viewing surface) of the display panel DP, pass through the display panel DP, and be transmitted to the one or more optical electronic devices 170, 170*a*, and 170*b* located under (on the opposite side of the viewing surface) the display panel DP.

The one or more optical electronic devices 170, 170*a*, and 170*b* may be devices that receive light transmitted through the display panel DP and perform predetermined functions according to the received light.

For example, the optical electronic devices 170, 170*a*, and 170*b* may include one or more of capturing devices such as a camera (an image sensor) and the like or detection sensors such as a proximity sensor and/or an illumination sensor.

Referring to FIGS. 1A to 1D, in the display apparatus 100 according to examples of the present disclosure, the display area DA may include a normal area NA and one or more optical areas DA1 and DA2.

The one or more optical areas DA1 and DA2 may be areas overlapping the one or more optical electronic devices 170, 170*a* and 170*b*.

According to an example of FIG. 1A, the display area DA may include the normal area NA and a first optical area DA1. Here, at least a portion of the first optical area DA1 may overlap a first optical electronic device 170.

Figure 1B:
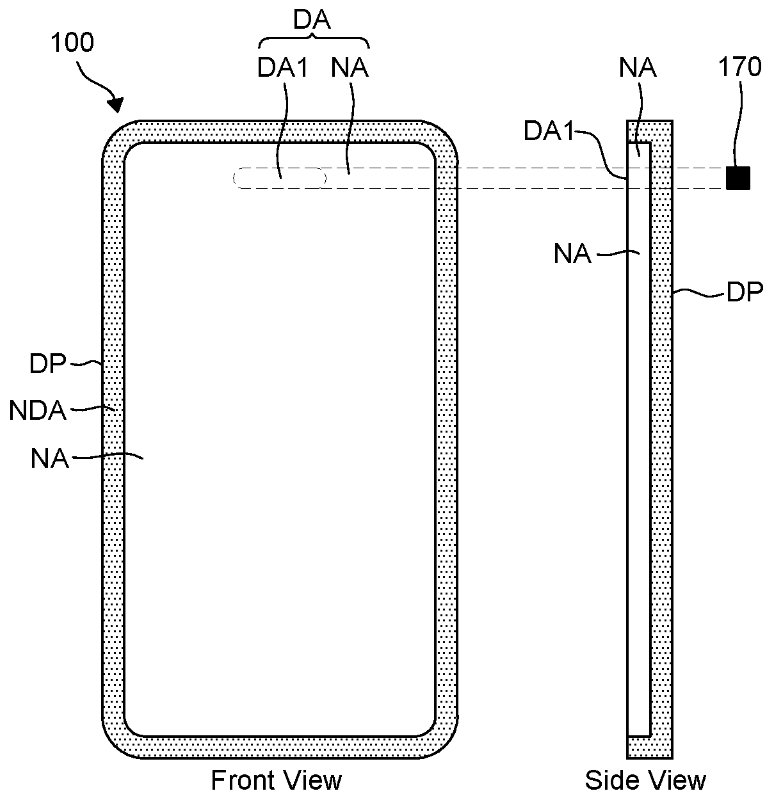

Although FIG. 1A illustrates a structure in which the first optical area DA1 has a circular shape, the shape of the first optical area DA1 according to the example of the present disclosure is not limited thereto. For example, as illustrated in FIG. 1B, the first optical area DA1 may have an octagonal shape, and may also have various other polygonal shapes.

Figure 1C:
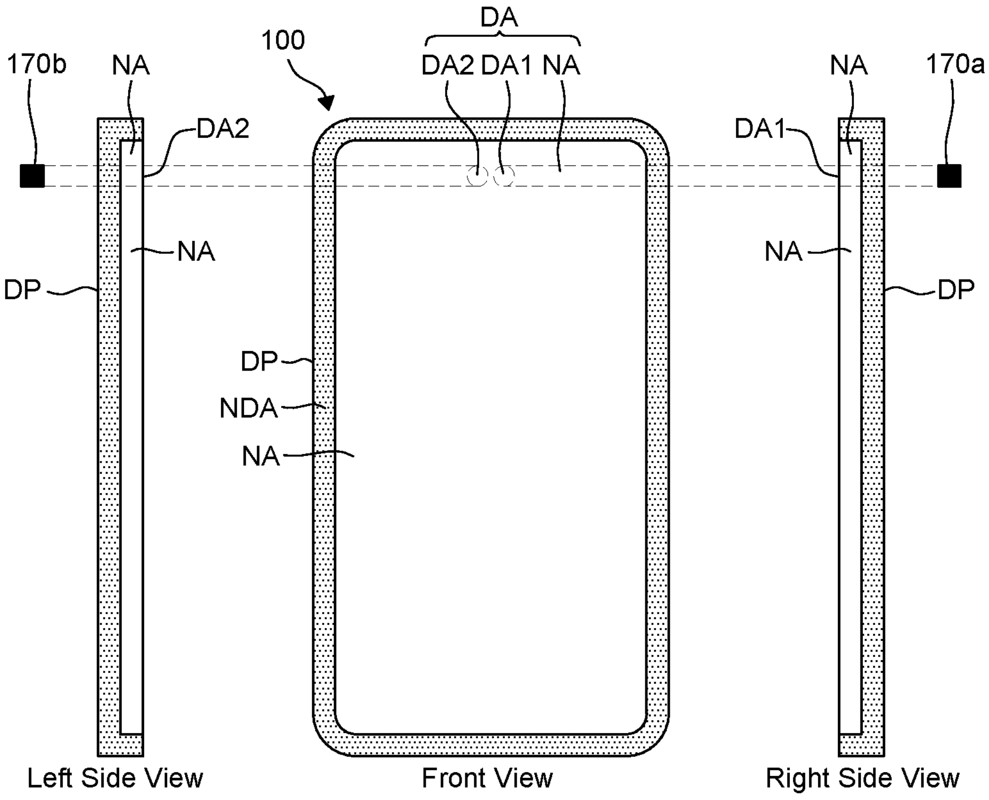

According to an example of FIG. 1C, the display area DA may include a normal area NA, a first optical area DA1 and a second optical area DA2. In the example of FIG. 1C, the normal area NA may exist between the first optical area DA1 and the second optical area DA2. Here, at least a portion of the first optical area DA1 may overlap a first optical electronic device 170*a*, and at least a portion of the second optical area DA2 may overlap a second optical electronic device 170*b*.

Figure 1D:
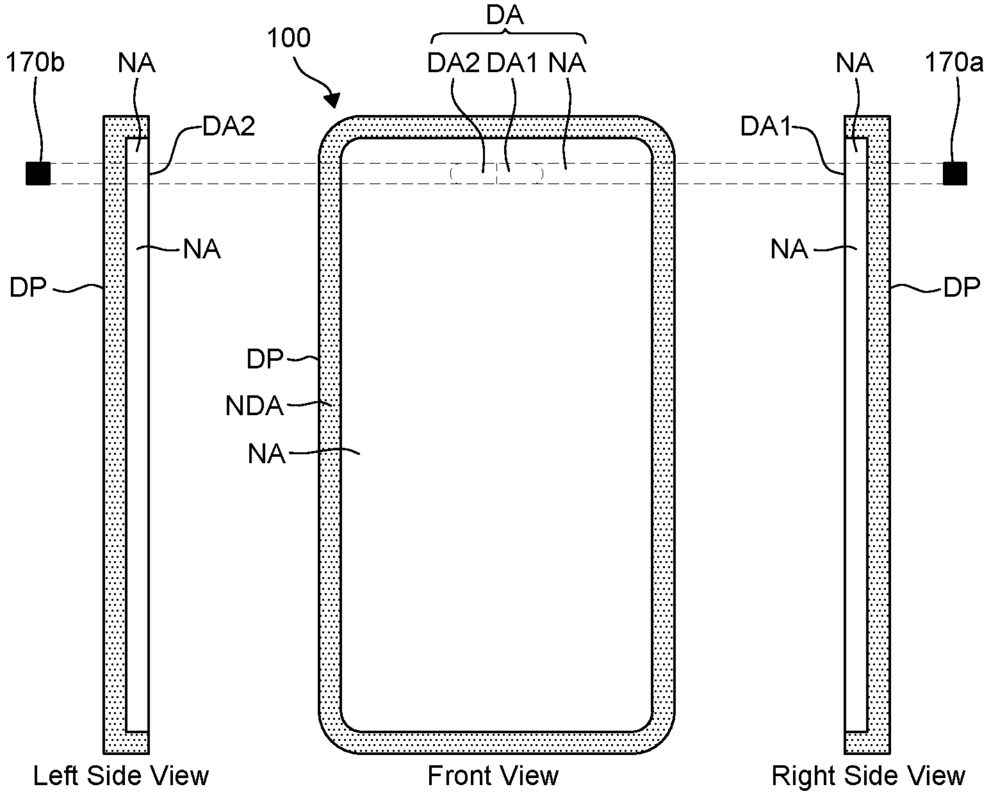

According to an example of FIG. 1D, the display area DA may include a normal area NA, a first optical area DA1 and a second optical area DA2. In the example of FIG. 1D, the normal area NA does not exist between the first optical area DA1 and the second optical area DA2. That is, the first optical area DA1 and the second optical area DA2 may contact each other. Here, at least a portion of the first optical area DA1 may overlap the first optical electronic device 170*a*, and at least a portion of the second optical area DA2 may overlap the second optical electronic device 170*b*.

The one or more optical areas DA1 and DA2 should have both an image display structure and a light-transmissive structure. That is, since the one or more optical areas DA1 and DA2 are parts of the display area DA, the sub-pixels for displaying images should be disposed in the one or more optical areas DA1 and DA2. The light-transmissive structure for transmitting light to the one or more optical electronic devices 170, 170*a*, and 170*b* should be formed in the one or more optical areas DA1 and DA2.

The one or more optical electronic devices 170, 170*a*, and 170*b* are devices that need to receive light, but are located behind the display panel DP (under the display panel DP, on the opposite side of the viewing surface) and receive light transmitted through the display panel DP.

The one or more optical electronic devices 170, 170*a*, and 170*b* may not be exposed to the front surface (the viewing surface) of the display panel DP. Therefore, when a user sees a front surface of the display apparatus 100, the optical electronic devices 170, 170*a*, and 170*b* may not be visible to the user.

For example, the first optical electronic devices 170 and 170*a* may be cameras, and the second optical electronic device 170*b* may be a detection sensor such as a proximity sensor and/or an illuminance sensor. For example, the detection sensor may be an infrared sensor that detects infrared rays.

Conversely, the first optical electronic devices 170 and 170*a* may be detection sensors, and the second optical electronic device 170*b* may be a camera.

Hereinafter, for convenience of explanation, it is exemplified that the first optical electronic devices 170 and 170*a* are cameras and the second optical electronic device 170*b* is a detection sensor. Here, the camera may be a camera lens or an image sensor.

When the first optical electronic devices 170 and 170*a* are cameras, they are located behind (under) the display panel DP, but may be front cameras that capture a front direction of the display panel DP. Accordingly, the user can capture an image through the camera invisible to the viewing surface while viewing the viewing surface of the display panel DP.

The normal area NA and the one or more optical areas DA1 and DA2 included in the display area DA are areas capable of displaying an image. However, the normal area NA is an area where it is unnecessary to form the light-transmissive structure therein, and the one or more optical areas DA1 and DA2 are areas where it is necessary to form the light-transmissive structure therein.

Accordingly, the one or more optical areas DA1 and DA2 should have a transmittance greater than or equal to a certain level, and the normal area NA may have no light transmittance or a lower transmittance lower than the certain level.

For example, the one or more optical areas DA1 and DA2 and the normal area NA may differ from each other in terms of resolution, sub-pixel arrangement structure, the number of sub-pixels per unit area, electrode structure, line structure, electrode arrangement structure, or line arrangement structure.

For example, the number of the sub-pixels per unit area in the one or more optical areas DA1 and DA2 may be smaller than the number of the sub-pixels per unit area in the normal area NA. That is, the resolution of the one or more optical areas DA1 and DA2 may be lower than that the resolution of the normal area NA. In this case, the number of the sub-pixels per unit area is a unit for measuring the resolution, and may also be referred to as PPI (pixels per inch), which means the number of pixels in one inch.

For example, the number of the sub-pixels per unit area in the first optical area DA1 may be smaller than the number of the sub-pixels per unit area in the normal area NA. Also, the number of the sub-pixels per unit area in the second optical area DA2 may be greater than or equal to the number of the sub-pixels per unit area in the first optical area DA1.

The first optical area DA1 may be variously shaped such as having a circular, elliptical, quadrangular, hexagonal, or octagonal shape. The second optical area DA2 may be variously shaped such as having a circular, elliptical, quadrangular, hexagonal, or octagonal shape. The first optical area DA1 and the second optical area DA2 may have the same shape or different shapes.

Referring to FIG. 1D, when the first optical area DA1 and the second optical area DA2 are in contact with each other, an entire optical area including the first optical area DA1 and the second optical area DA2 may also be variously shaped such as having a circular, elliptical, quadrangular, hexagonal, or octagonal shape.

Hereinafter, it is exemplified that each of the first optical area DA1 and the second optical area DA2 is circular, for convenience of explanation.

In the display apparatus 100 according to an example of the present disclosure, when the first optical electronic devices 170 and 170*a* that are not exposed to the outside and hidden under the display panel DP are cameras, the display apparatus 100 according to an example of the present disclosure may be referred to as a display to which an under-display camera (UDC) technology is applied.

According to this, in the case of the display apparatus 100 according to an example of the present disclosure, since a camera hole or a notch for camera exposure does not need to be formed in the display panel DP, an area of the display area DA is not reduced. Accordingly, since it is unnecessary to form a camera hole or a notch for camera exposure in the display panel DP, a size of a bezel area can be reduced and design restrictions can be removed, so that a degree of freedom in design can increase.

In the display apparatus 100 according to an example of the present disclosure, although the one or more optical electronic devices 170, 170*a*, and 170*b* are located and hidden behind the display panel DP, the one or more optical electronic devices 170, 170*a*, and 170*b* should be able to normally receive light and normally perform predetermined functions.

In addition, in the display apparatus 100 according to an example of the present disclosure, although the one or more optical electronic devices 170, 170*a*, and 170*b* are located and hidden behind the display panel DP and disposed to overlap the display area DA, it should be possible to normally display an image in the one or more optical areas DA1 and DA2 overlapping the one or more optical electronic devices 170, 170*a*, and 170*b* in the display area DA.

Accordingly, the display apparatus 100 according to an example of the present disclosure can have a structure capable of improving transmittances of the first optical area DA1 and the second optical area DA2 that overlap the optical electronic devices 170, 170*a*, and 170*b*.

Figure 2:
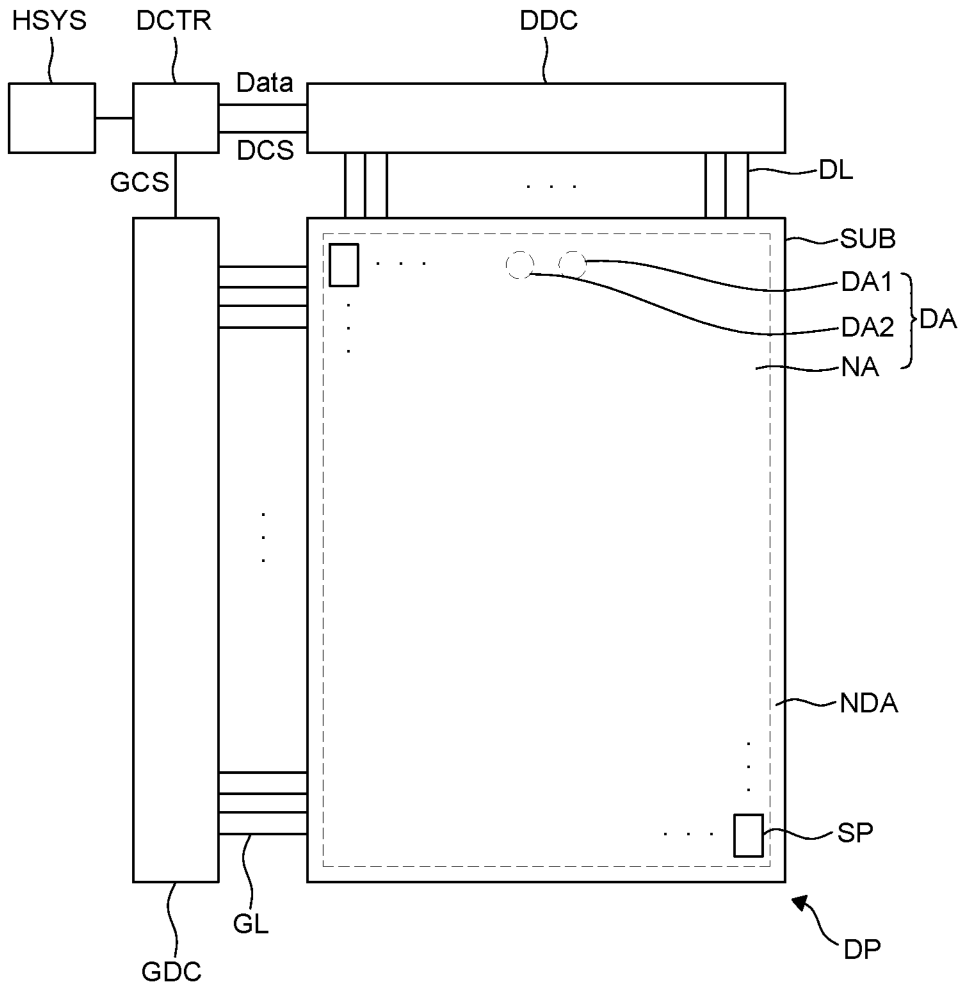
FIG. 2 is a system configuration diagram of the display apparatus according to an example of the present disclosure.

FIG. 2 is a system configuration diagram of the display apparatus according to an example of the present disclosure.

Referring to FIG. 2, the display apparatus 100 may include the display panel DP and a display driving circuit as components for displaying an image. The display driving circuit is a circuit for driving the display panel DP, and may include a data driving circuit DDC, a gate driving circuit GDC, a display controller DCTR, and the like.

The display panel DP may include the display area DA where an image is displayed and the non-display area NDA where an image is not displayed. The non-display area NDA may be an area outside the display area DA, and may also be referred to as a bezel area. All or part of the non-display area NDA may be an area visible from the front surface of the display apparatus 100 or an area that is bent and not visible from the front surface of the display apparatus 100.

The display panel DP may include a substrate SUB and a plurality of sub-pixels SP disposed on the substrate SUB.

Also, the display panel DP may further include various types of signal lines to drive the plurality of sub-pixels SP.

The display apparatus 100 according to examples of the present disclosure may be a liquid crystal display apparatus or may be a self-emitting display apparatus in which the display panel DP itself emits light. When the display apparatus 100 according to examples of the present disclosure is a self-emitting display apparatus, each of the plurality of sub-pixels SP may include a light emitting element.

For example, the display apparatus 100 according to examples of the present disclosure may be an organic light emitting display apparatus in which the light emitting element is implemented with an organic light emitting diode (OLED). For another example, the display apparatus 100 according to examples of the present disclosure may be an inorganic light emitting display apparatus in which the light emitting element is implemented with an inorganic-based light emitting diode. As another example, the display apparatus 100 according to examples of the present disclosure may be a quantum dot display apparatus in which the light emitting element is implemented with quantum dots, which are semiconductor crystals emitting light itself.

A structure of each of the plurality of sub-pixels SP may vary according to a type of the display apparatus 100. For example, when the display apparatus 100 is a self-emitting display apparatus in which the sub-pixels SP emit light by themselves, each of the sub-pixels SP may include the light emitting element emitting light itself, one or more transistors, and one or more capacitors.

The various types of signal lines may include a plurality of data lines DL for transmitting data signals (also referred to as data voltages or video signals), a plurality of gate lines GL for transmitting gate signals (also referred to as scan signals), and the like.

The plurality of data lines DL and the plurality of gate lines GL may cross each other. Each of the plurality of data lines DL may be disposed to extend in a first direction. Each of the plurality of gate lines GL may be disposed to extend in a second direction. Here, the first direction may be a column direction and the second direction may be a row direction. Alternatively, the first direction may be the row direction and the second direction may be the column direction.

The data driving circuit DDC is a circuit for driving the plurality of data lines DL, and may output data signals to the plurality of data lines DL. The gate driving circuit GDC is a circuit for driving the plurality of gate lines GL, and may output gate signals to the plurality of gate lines GL.

The display controller DCTR is a device for controlling the data driving circuit DDC and the gate driving circuit GDC and may control a driving timing of the plurality of data lines DL and a driving timing of the plurality of gate lines GL.

The display controller DCTR may supply data driving control signals DCS to the data driving circuit DDC to control the data driving circuit DDC, and supply gate driving control signals GCS to the gate driving circuit GDC to control the gate driving circuit GDC.

The display controller DCTR may receive input image data from a host system HSYS and supply image data Data to the data driving circuit DDC based on the input image data.

The data driving circuit DDC may supply data signals to the plurality of data lines DL according to driving timing control of the display controller DCTR. The data driving circuit DDC may receive the image data Data in a digital format from the display controller DCTR, convert the received image data Data into data signals in an analog format, and output the signals to the plurality of data lines DL.

The gate driving circuit GDC may supply gate signals to the plurality of gate lines GL according to timing control of the display controller DCTR. The gate driving circuit GDC may be supplied with a first gate voltage corresponding to a turn-on level voltage and a second gate voltage corresponding to a turn-off level voltage together with various gate driving control signals GCS to thereby generate the gate signals and may supply the generated gate signals to the plurality of gate lines GL.

The gate driving circuit GDC supplies the gate signals to the gate lines GL according to the gate driving control signals GCS supplied from the display controller DCTR. The gate driving circuit GDC may be disposed on one side or both sides of the display apparatus 100 in a gate in panel (GIP) method.

The gate driving circuit GDC sequentially outputs the gate signals to the plurality of gate lines GL under control of the display controller DCTR. The gate driving circuit GDC may sequentially supply the gate signals to the gate lines GL by shifting the gate signals using shift registers.

The gate signals may include a scan signal and an emission control signal in an organic light emitting display apparatus. The scan signal includes a scan signal pulse swinging between the first gate voltage and the second gate voltage. The emission control signal may include an emission control signal pulse swinging between a third gate voltage and a fourth gate voltage.

The scan signal pulse is synchronized with a data voltage Vdata to select the sub-pixels SP of a line in which data is to be written. The emission control signal defines an emission time of each of the sub-pixels SP.

The gate driving circuit GDC may include an emission control signal driver outputting the emission control signal and at least one scan driver outputting the scan signal.

The emission control signal driver outputs the emission control signal in response to a start pulse and a shift clock from the display controller DCTR, and sequentially shifts the emission control signal pulse according to the shift clock.

The at least one scan driver outputs the scan signal in response to the start pulse and the shift clock from the display controller DCTR, and shifts the scan signal pulse according to a shift clock timing.

In the gate driving circuit GDC disposed in the GIP method, the shift registers may be configured symmetrically on both sides of the display area DA. In addition, in the gate driving circuit GDC, the shift register on one side of the display area DA may be configured to include the at least one scan driver and the emission control signal driver, and the shift register on the other side of the display area DA may be configured to include the at least one scan driver, respectively. However, the present disclosure is not limited thereto, and the emission control signal driver and the at least one scan driver may be differently disposed according to embodiments.

The data driving circuit DDC may be connected to the display panel DP in a tape automated bonding (TAB) method, may be connected to a bonding pad of the display panel DP in a chip on glass (COG) or chip on panel (COP) method, or may be implemented in a chip on film (COF) method and connected to the display panel DP.

The gate driving circuit GDC may be connected to the display panel DP in the tape automated bonding (TAB) method, may be connected to a bonding pad of the display panel DP in the chip on glass (COG) or chip on panel (COP) method, or may be connected to the display panel DP in the chip on film (COF) method. Alternatively, the gate driving circuit GDC may be formed in a gate in panel (GIP) type in the non-display area NDA of the display panel DP. The gate driving circuit GDC may be disposed on or connected to the substrate. That is, in the case of the GIP type, the gate driving circuit GDC may be disposed in the non-display area NDA of the substrate. The gate driving circuit GDC may be connected to the substrate in the case of a chip on glass (COG) type or a chip on film (COF) type.

Meanwhile, at least one driving circuit of the data driving circuit DDC and the gate driving circuit GDC may be disposed in the display area DA of the display panel DP. For example, at least one driving circuit of the data driving circuit DDC and the gate driving circuit GDC may be disposed not to overlap the sub-pixels SP, or may be disposed to overlap the sub-pixels SP in part or entirely.

The data driving circuit DDC may be connected to one side (e.g., an upper side or a lower side) of the display panel DP. Depending on a driving method, a panel design method or the like, the data driving circuit DDC may be connected to both sides (e.g., the upper and lower sides) of the display panel DP or may be connected to two or more of four side surfaces of the display panel DP.

The gate driving circuit GDC may be connected to one side (e.g., a left side or a right side) of the display panel DP. Depending on the driving method, the panel design method or the like, the gate driving circuit GDC may be connected to both sides (e.g., the left and right sides) of the display panel DP or may be connected to two or more of four side surfaces of the display panel DP.

The display controller DCTR may be implemented as a component separate from the data driving circuit DDC, or may be integrated with the data driving circuit DDC and implemented as an integrated circuit.

The display controller DCTR may be a timing controller used in general display technology, or may be a control device capable of performing other control functions by including the timing controller, or may be a control device different from the timing controller, or may be a circuit in the control device. The display controller DCTR may be implemented with various circuits or electronic components such as an integrated circuit (IC), a field programmable gate array (FPGA), an application specific integrated circuit (ASIC), or a processor.

The display controller DCTR may be mounted on a printed circuit board or a flexible printed circuit, and may be electrically connected to the data driving circuit DDC and the gate driving circuit GDC through the printed circuit board or the flexible printed circuit.

The display controller DCTR may transmit and receive signals to and from the data driving circuit DDC according to one or more predetermined interfaces. Here, for example, the interfaces may include a low voltage differential signaling (LVDS) interface, an embedded clock point-to-point interface (EPI), a serial peripheral interface (SPI), and the like.

To further provide a touch sensing function as well as an image display function, the display apparatus 100 according to examples of the present disclosure may include a touch sensor, and a touch sensing circuit that detects whether a touch has occurred by a touch object such as a finger or a pen by sensing the touch sensor, or detects a touch position.

The touch sensing circuit may further include a touch driving circuit that generates and outputs touch sensing data by driving and sensing the touch sensor, and a touch controller that can sense occurrence of the touch or detect the touch position using the touch sensing data.

The touch sensor may include a plurality of touch electrodes. The touch sensor may further include a plurality of touch lines for electrically connecting the plurality of touch electrodes and the touch driving circuit.

The touch sensor may be present in the form of a touch panel outside the display panel DP or present within the display panel DP. When the touch sensor exists outside the display panel DP in the form of a touch panel, the touch sensor is referred to as an external type. When the touch sensor is the external type, the touch panel and the display panel DP may be separately manufactured and combined during an assembly process. The external type of touch panel may include a substrate for a touch panel, a plurality of touch electrodes on the substrate for the touch panel, and the like.

When the touch sensor is present within the display panel DP, the touch sensor may be formed on the substrate SUB along with signal lines and electrodes related to display driving during a manufacturing process of the display panel DP.

A touch driving circuit may supply a touch driving signal to at least one of the plurality of touch electrodes and sense the at least one of the plurality of touch electrodes to generate touch sensing data.

The touch sensing circuit may perform touch sensing using a self-capacitance sensing method or a mutual-capacitance sensing method.

When the touch sensing circuit performs touch sensing in the self-capacitance sensing method, the touch sensing circuit may perform touch sensing based on capacitance between each touch electrode and a touch object (e.g., a finger or a pen).

According to the self-capacitance sensing method, each of the plurality of touch electrodes may serve as both a driving touch electrode and a sensing touch electrode. The touch driving circuit may drive all or part of the plurality of touch electrodes and sense all or part of the plurality of touch electrodes.

When the touch sensing circuit performs touch sensing in the mutual-capacitance sensing method, the touch sensing circuit may perform touch sensing based on capacitance between touch electrodes.

According to the mutual-capacitance sensing method, the plurality of touch electrodes is divided into driving touch electrodes and sensing touch electrodes. The touch driving circuit may drive the driving touch electrodes and sense the sensing touch electrodes.

The touch driving circuit and the touch controller included in the touch sensing circuit may be implemented as separate devices or a single device. Also, the touch driving circuit and the data driving circuit DDC may be implemented as separate devices or may be implemented as a single device.

In addition, the display apparatus 100 may further include a power supply circuit for supplying various types of power to the display driving circuit and/or the touch sensing circuit, and the like.

The display apparatus 100 according to examples of the present disclosure may be a mobile terminal such as a smart phone or tablet, or a monitor or television (TV) of various sizes, but the present disclosure is not limited thereto. In addition, the display apparatus 100 according to examples of the present disclosure may be a display of various sizes and various types, capable of displaying various kinds of information or images.

As described above, in the display panel DP, the display area DA may include the normal area NA and the one or more optical areas DA1 and DA2.

The normal area NA and the one or more optical areas DA1 and DA2 are areas capable of displaying an image. However, the normal area NA is an area where it is unnecessary to form the light-transmissive structure therein, and the one or more optical areas DA1 and DA2 are areas where it is necessary to form the light-transmissive structure therein.

As described above, in the display panel DP, the display area DA may include the normal area NA and the one or more optical areas DA1 and DA2.

Hereinafter, it is assumed that the display area DA includes both the first optical area DA1 and the second optical area DA2 (FIGS. 1C and 1D), for convenience of explanation.

Figure 3:
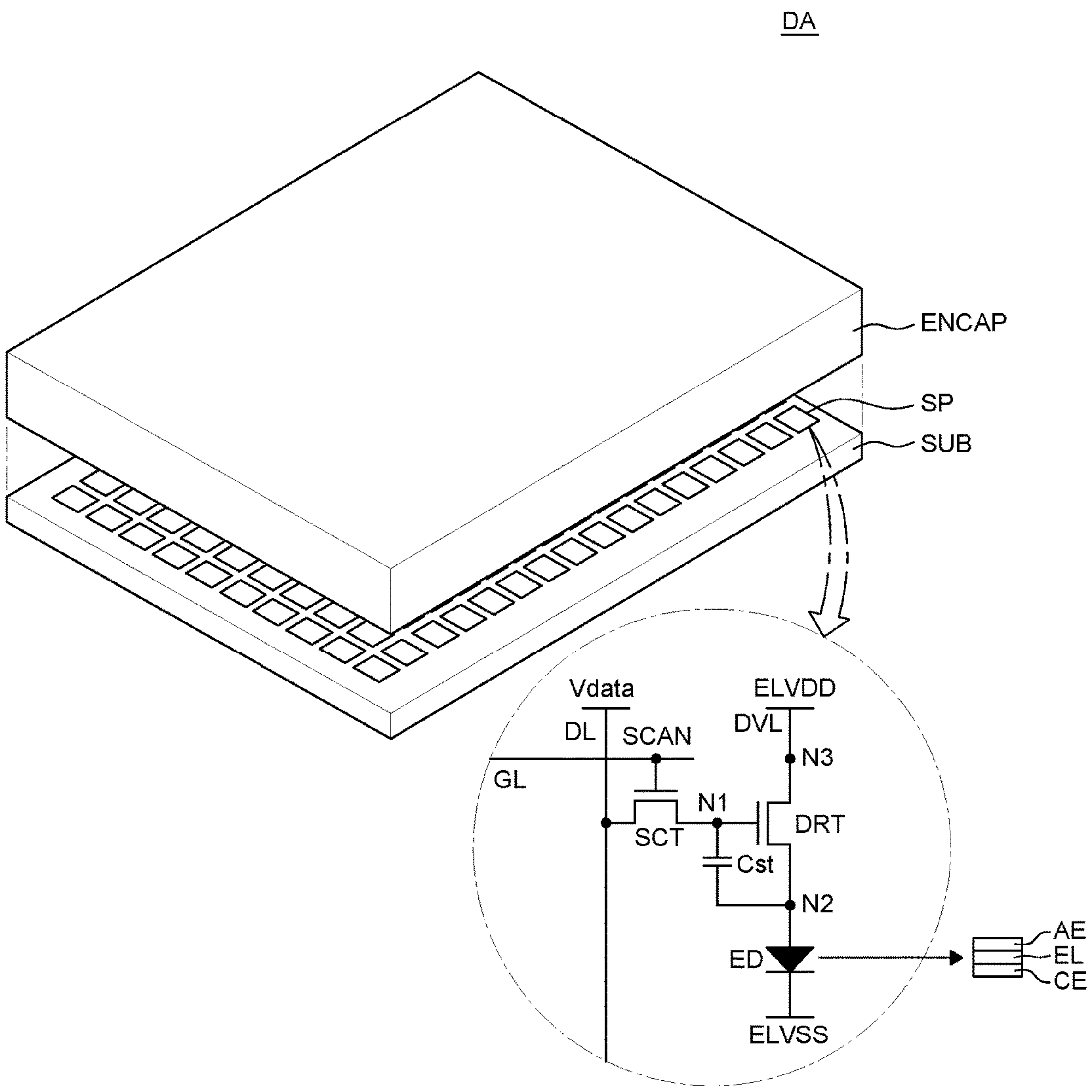
FIG. 3 is an equivalent circuit diagram of sub-pixels in a display panel according to an example of the present disclosure.

FIG. 3 is an equivalent circuit diagram of sub-pixels in a display panel according to an example of the present disclosure.

Each of the sub-pixels SP disposed in the normal area NA, the first optical area DA1, and the second optical area DA2 that are included in the display area DA of the display panel DP, may include a light emitting element ED, a driving transistor DRT for driving the light emitting element ED, a scan transistor SCT for transferring the data voltage Vdata to a first node N1 of the driving transistor DRT, a storage capacitor Cst for maintaining a constant voltage during one frame, and the like.

The driving transistor DRT may include the first node N1 to which the data voltage Vdata can be applied, a second node N2 electrically connected to the light emitting element ED, and a third node N3 to which a driving voltage ELVDD is applied from a driving voltage line DVL. In the driving transistor DRT, the first node N1 may be a gate node, the second node N2 may be a source node or a drain node, and the third node N3 may be a drain node or a source node.

The light emitting element ED may include an anode electrode AE, a light emitting layer EL, and a cathode electrode CE. The anode electrode AE may be a pixel electrode disposed in each of the sub-pixels SP, and may be electrically connected to the second node N2 of the driving transistor DRT of each sub-pixel SP. The cathode electrode CE may be a common electrode commonly disposed in the plurality of sub-pixels SP, and a ground voltage ELVSS may be applied to the cathode electrode CE.

For example, the anode electrode AE may be a pixel electrode, and the cathode electrode CE may be a common electrode. Conversely, the anode electrode AE may be a common electrode, and the cathode electrode CE may be a pixel electrode. Hereinafter, for convenience of explanation, it is assumed that the anode electrode AE is a pixel electrode, and the cathode electrode CE is a common electrode.

For example, the light emitting element ED may be an organic light emitting diode (OLED), an inorganic light emitting diode, or a quantum dot light emitting element. In this case, when the light emitting element ED is an OLED, the light emitting layer EL of the light emitting element ED may include an organic light emitting layer containing an organic material.

Whether the scan transistor SCT is on or off (on/off) may be controlled by a scan signal SCAN, which is a gate signal applied through the gate line GL, and the scan transistor SCT may be electrically connected between the first node N1 of the driving transistor DRT and the data line DL.

The storage capacitor Cst may be electrically connected between the first node N1 and the second node N2 of the driving transistor DRT.

As illustrated in FIG. 3, each sub-pixel SP may have a 2T-1C (2 Transistor-1 Capacitor) structure including two transistors DRT and SCT and one capacitor Cst. In some cases, it may further include one or more transistors, or may further include one or more capacitors.

The storage capacitor Cst is not a parasitic capacitor (e.g., Cgs or Cgd) i.e., an internal capacitor that may exist between the first node N1 and the second node N2 of the driving transistor DRT, but may be an external capacitor intentionally designed outside the driving transistor DRT.

Each of the driving transistor DRT and scan transistor SCT may be an n-type transistor or a p-type transistor.

Since circuit elements (in particular, the light emitting elements ED) in each of the sub-pixels SP are vulnerable to external moisture or oxygen, an encapsulation layer ENCAP may be disposed on the display panel DP to prevent penetration of external moisture or oxygen into the circuit elements (in particular, the light emitting elements ED). The encapsulation layer ENCAP may be disposed to cover the light emitting elements ED.

Meanwhile, a pixel density differential design method may be applied to increase the transmittance of at least one of the first optical area DA1 and the second optical area DA2. According to the pixel density differential design method, the display panel DP may be designed such that the number of the sub-pixels per unit area in at least one of the first optical area DA1 and the second optical area DA2 is fewer than the number of the sub-pixels per unit area in the normal area NA.

However, unlike this, in some cases, another method for increasing the transmittance of at least one of the first optical area DA1 and the second optical area DA2 is to apply a pixel size differential design method. According to the pixel size differential design method, the display panel DP may be designed such that the number of the sub-pixels per unit area in at least one of the first optical area DA1 and the second optical area DA2 is equal to or similar to the number of the sub-pixels per unit area in the normal area NA, while a size of each of the sub-pixels SP (i.e., a size of an emission area) disposed in at least one of the first optical area DA1 and the second optical area DA2 is smaller than a size of each of the sub-pixels SP (i.e., a size of an emission area) disposed in the normal area NA.

Hereinafter, although two methods (the pixel density differential design method and the pixel size differential design method) for increasing the transmittance of at least one of the first optical area DA1 and the second optical area DA2 may be applied, it is assumed that the pixel density differential design method is applied, for convenience of explanation.

Figure 4:
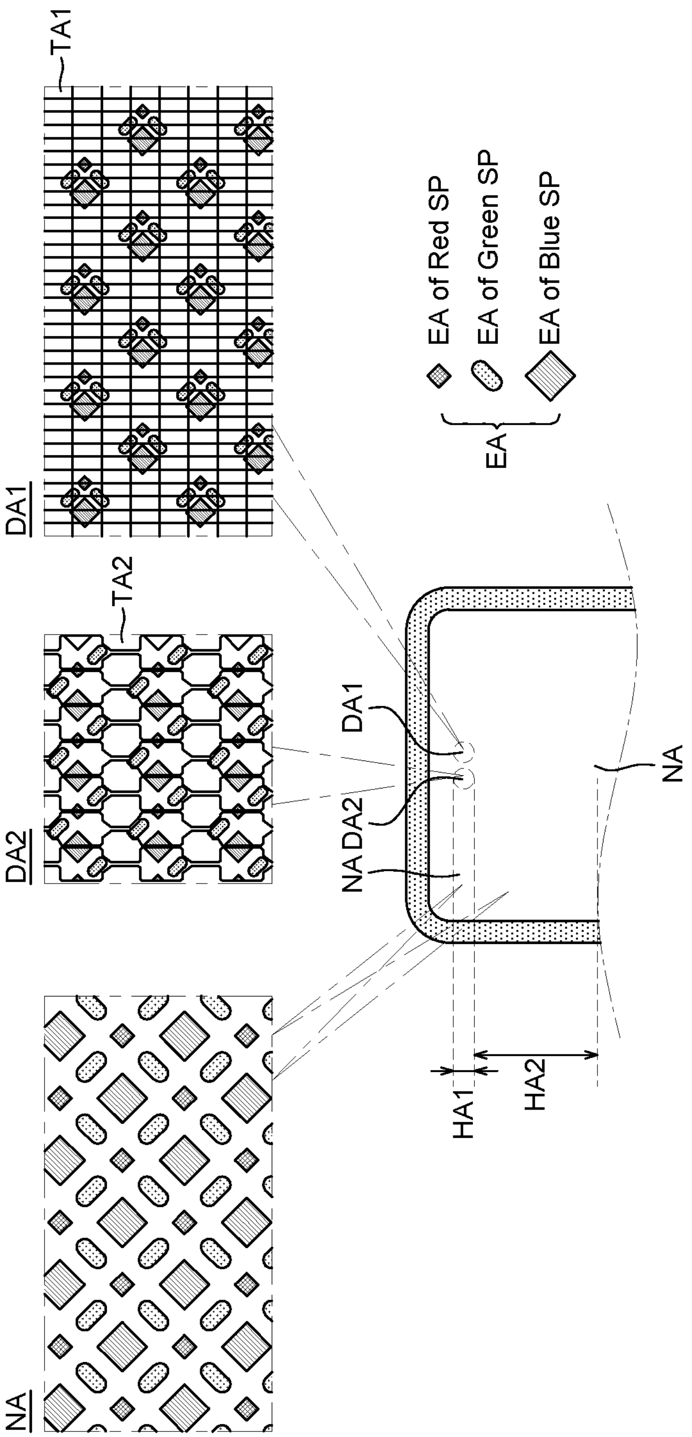
FIG. 4 is a view illustrating an example in which sub-pixels of a display area are disposed according to an example of the present disclosure.

FIG. 4 is a view illustrating an example in which sub-pixels of a display area are disposed according to an example of the present disclosure.

FIG. 4 illustrates arrangements of sub-pixels SP in three areas NA, DA1, and DA2 included in the display area DA of the display panel according to an example of the present disclosure.

Referring to FIG. 4, the plurality of sub-pixels SP may be disposed in each of the normal area NA, the first optical area DA1 and the second optical area DA2 included in the display area.

For example, the plurality of sub-pixels SP may include red sub-pixels Red SP emitting red light, green sub-pixels Green SP emitting green light, and blue sub-pixels Blue SP emitting blue light.

Accordingly, each of the normal area NA, the first optical area DA1, and the second optical area DA2 may include the emission areas EA of the red sub-pixels Red SP, the emission areas EA of the green sub-pixels Green SP, and the emission areas EA of the blue sub-pixels Blue SP.

Referring to FIG. 4, the normal area NA may not include a light-transmissive structure and may include the emission areas EA.

However, the first optical area DA1 and the second optical area DA2 should include a light-transmissive structure as well as including the emission areas EA.

Accordingly, the first optical area DA1 may include the emission areas EA and first transmissive areas TA1, and the second optical area DA2 may include the emission areas EA and second transmissive areas TA2.

The emission areas EA and the transmissive areas TA1 and TA2 may be distinguished according to whether light is transmitted therethrough. That is, the emission areas EA may be areas in which light transmission is not possible, and the transmissive areas TA1 and TA2 may be areas in which light transmission is possible.

Also, the emission areas EA and the transmissive areas TA1 and TA2 may be distinguished according to whether a specific metal layer is formed therein. For example, a cathode electrode may be formed in the emission areas EA, and the cathode electrode may not be formed in the transmissive areas TA1 and TA2. In addition, a light blocking layer is formed in the emission areas EA, but the light blocking layer may not be formed in the transmissive areas TA1 and TA2.

Since the first optical area DA1 includes the first transmissive areas TA1 and the second optical area DA2 includes the second transmissive areas TA2, both of the first optical area DA1 and the second optical area DA2 may transmit light therethrough.

The transmittance (a degree of transmittance) of the first optical area DA1 and the transmittance (a degree of transmittance) of the second optical area DA2 may be equal to each other.

In this case, the first transmissive area TA1 of the first optical area DA1 and the second transmissive area TA2 of the second optical area DA2 may have the same shape or size. Alternatively, even if shapes or sizes of the first transmissive areas TA1 of the first optical area DA1 and the second transmissive areas TA2 of the second optical area DA2 are different, a proportion of the first transmission areas TA1 in the first optical area DA1 and a proportion of the second transmission areas TA2 in the second optical area DA2 may be equal to each other.

Unlike this, the transmittance (the degree of transmittance) of the first optical area DA1 and the transmittance (the degree of transmittance) of the second optical area DA2 may be different from each other.

In this case, the first transmissive areas TA1 of the first optical area DA1 and the second transmissive areas TA2 of the second optical area DA2 may have different shapes or sizes. Alternatively, even if shapes or sizes of the first transmissive areas TA1 of the first optical area DA1 and the second transmissive areas TA2 of the second optical area DA2 are identical to each other, the proportion of the first transmission areas TA1 in the first optical area DA1 and the proportion of the second transmission areas TA2 in the second optical area DA2 may be different from each other.

For example, when the first optical electronic device overlapping the first optical area DA1 is a camera and the second optical electronic device overlapping the second optical area DA2 is a detection sensor, the camera may require a larger amount of light than the detection sensor.

Accordingly, the transmittance (the degree of transmittance) of the first optical area DA1 may be higher than the transmittance (the degree of transmittance) of the second optical area DA2.

In this case, the first transmissive areas TA1 of the first optical area DA1 may have a larger size than the second transmissive areas TA2 of the second optical area DA2. Alternatively, even if the first transmissive areas TA1 of the first optical area DA1 have a size equal to that of the second transmissive areas TA2 of the second optical area DA2, the proportion of the first transmission areas TA1 in the first optical area DA1 may be greater than the proportion of the second transmission areas TA2 in the second optical area DA2.

Hereinafter, for convenience of explanation, a case where the transmittance (the degree of transmittance) of the first optical area DA1 is greater than that of the second optical area DA2 will be described as an example.

In an example of the present disclosure, the transmissive areas TA1 and TA2 illustrated in FIG. 4 may also be referred to as transparent areas, and the transmittance may also be referred to as transparency.

In an example of the present disclosure, it is assumed that the first optical area DA1 and the second optical area DA2 are located at an upper end portion of the display area of the display panel and disposed side by side, as illustrated in FIG. 4.

Referring to FIG. 4, a horizontal display area in which the first optical area DA1 and the second optical area DA2 are disposed is referred to as a first horizontal display area HA1, and a horizontal display area in which the first optical area DA1 and the second optical area DA2 are not disposed is referred to as a second horizontal display area HA2.

The first horizontal display area HA1 may include the normal area NA, the first optical area DA1 and the second optical area DA2. On the other hand, the second horizontal display area HA2 may include only the normal area NA.

Figure 5A:
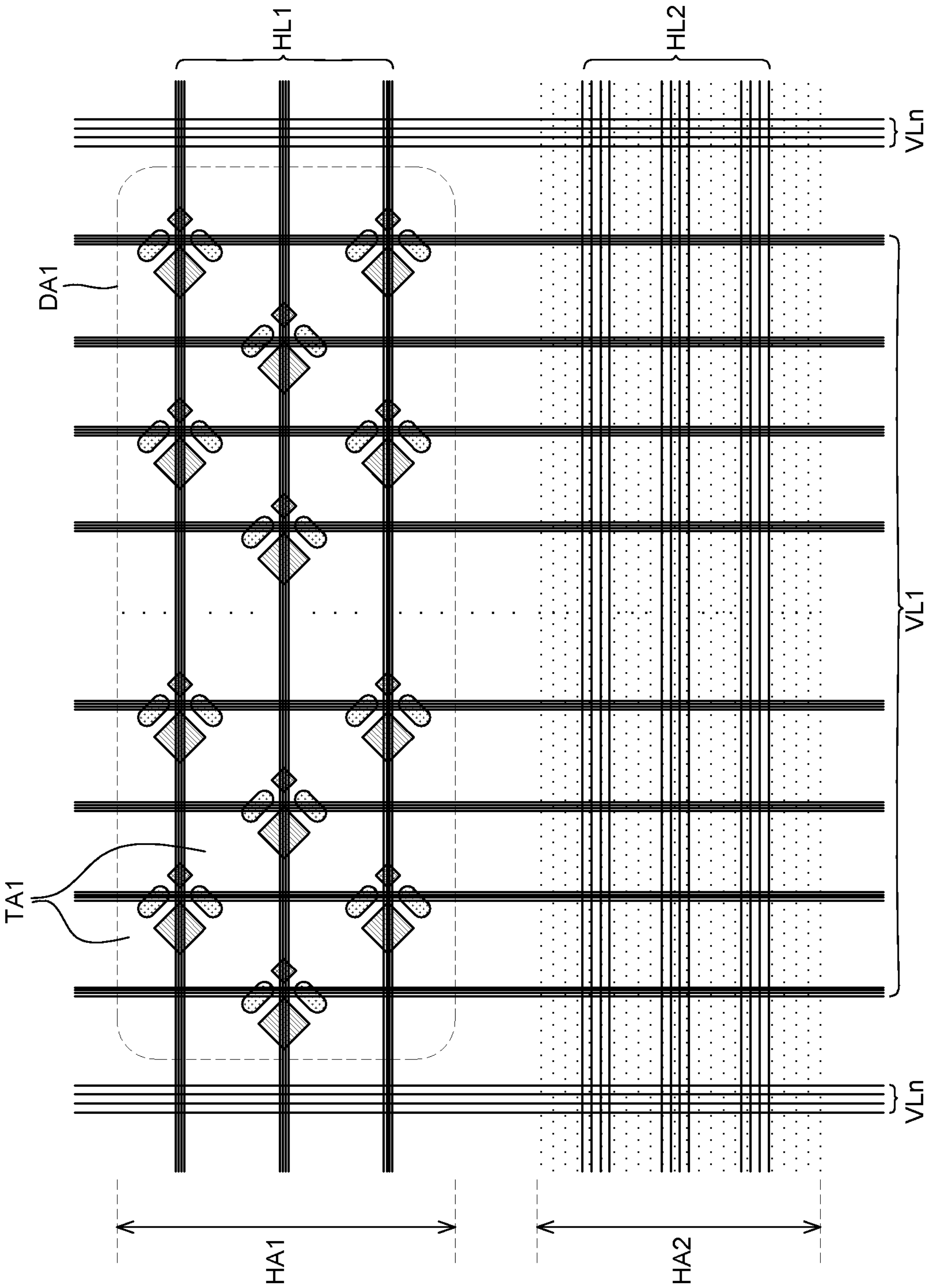
FIG. 5A is a view illustrating an example in which signal lines are disposed in each of a first optical area and a normal area according to an example of the present disclosure.
Figure 5B:
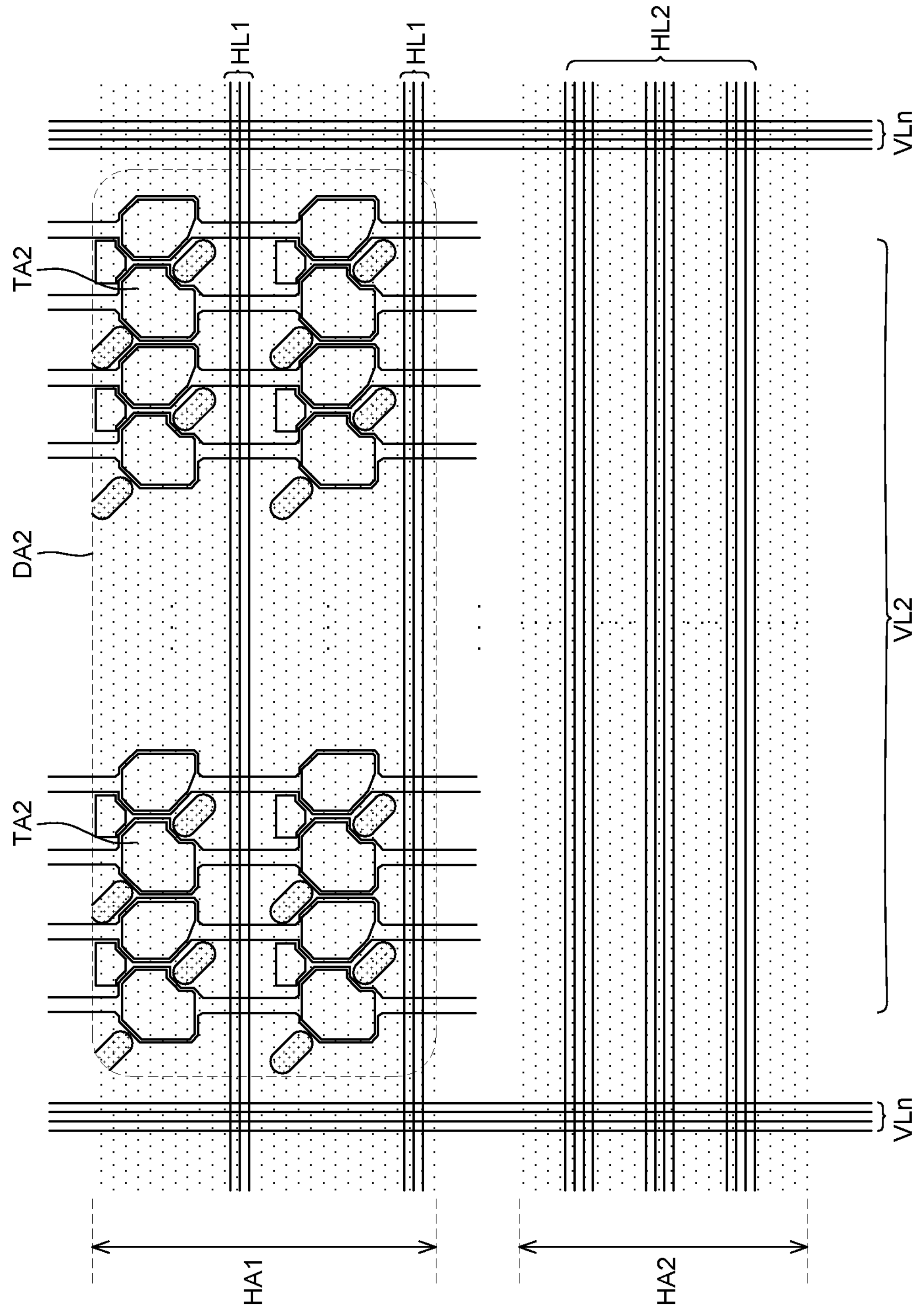
FIG. 5B is a view illustrating an example in which signal lines are disposed in each of a second optical area and a normal area according to an example of the present disclosure.

FIG. 5A is a view illustrating an example in which signal lines are disposed in each of a first optical area and a normal area according to an example of the present disclosure. FIG. 5B is a view illustrating an example in which signal lines are disposed in each of a second optical area and a normal area according to an example of the present disclosure.

FIG. 5A illustrates arrangements of signal lines in each of the first optical area DA1 and the normal area NA in the display panel DP according to an example of the present disclosure, and FIG. 5B illustrates arrangements of signal lines in each of the second optical area DA2 and the normal area NA in the display panel DP according to an example of the present disclosure.

FIG. 5A illustrates a portion of the first horizontal display area HA1 and a portion of the first optical area DA1. FIG. 5B illustrates a portion of the second horizontal display area HA2 and a portion of the second optical area DA2. Also, as illustrated in FIGS. 5A and 5B, the first horizontal display area HA1 includes the normal area, the first optical area DA1 and the second optical area DA2, and the second horizontal display area HA2 includes the normal area.

Various types of horizontal lines HL1 and HL2 and vertical lines VLn, VL1 and VL2 may be disposed on the display panel DP.

In an example of the present disclosure, a horizontal direction and a vertical direction are two directions that intersect, and the horizontal direction and the vertical direction may differ depending on a viewing direction. For example, in an example of the present disclosure, the horizontal direction may be a direction in which one gate line is disposed to extend, and the vertical direction may be a direction in which one data line is disposed to extend.

Referring to FIGS. 5A and 5B, the horizontal lines disposed on the display panel DP may include first horizontal lines HL1 disposed in the first horizontal display area HA1 and second horizontal lines HL2 disposed in the second horizontal display area HA2. In this case, the first horizontal line HL1 and the second horizontal line HL2 may be gate lines. The gate lines may include various types of gate lines according to the structure of the sub-pixel.

Referring to FIGS. 5A and 5B, the vertical lines disposed on the display panel DP may include normal vertical lines VLn disposed only in the normal area, first vertical lines VL1 passing both the first optical area DA1 and the normal area, and second vertical lines VL2 passing both the second optical area DA2 and the normal area.

The vertical lines disposed on the display panel DP may include the data lines, the driving voltage line, and the like, and may further include a reference voltage line, an initialization voltage line and the like. That is, the normal vertical lines VLn, the first vertical lines VL1, and the second vertical lines VL2 may include the data lines, the driving voltage line, and the like, and may further include the reference voltage line, the initialization voltage line and the like.

In an example of the present disclosure, the term "horizontal" of the horizontal line provides a general direction of a signal that is transmitted from a left side (or a right side) to the right side (or the left side) and the "horizontal" line may not extend in the form of a straight line only in an accurate horizontal direction. That is, in FIGS. 5A and 5B, the first horizontal line HL1 and the second horizontal line HL2 are respectively illustrated as straight lines, but at least one of the first horizontal line HL1 and the second horizontal line HL2 may include a bent or curved portion.

In an example of the present disclosure, the term "vertical" of the vertical line provides a general direction of a signal that is transmitted from an upper side (or a lower side) to the lower side (or the upper side) and the "vertical" line may not extend in the form of a straight line only in an accurate vertical direction. That is, in FIGS. 5A and 5B, the normal vertical lines VLn, the first vertical lines VL1, and the second vertical lines VL2 are respectively illustrated as straight lines, but at least one of the normal vertical lines VLn, the first vertical line VL1, and the second vertical line VL2 may include a bent or curved portion.

Referring to FIGS. 4 and 5A, the first optical area DA1 included in the first horizontal area HA1 may include the emission areas EA and the first transmissive area TA1. Within the first optical area DA1, an area outside the first transmissive area TA1 may include the emission areas EA.

Referring to FIG. 5A, to improve the transmittance of the first optical area DA1, the first horizontal lines HL1 passing through the first optical area DA1 may pass through the first optical area DA1 while avoiding the first transmissive areas TA1 within the first optical area DA1. Thus, each of the first horizontal lines HL1 passing through the first optical area DA1 may include a curved section or a bending section that extends outside an outer edge of each first transmissive area TA1. The first horizontal lines HL1 passing through the first optical area DA1 and the second horizontal lines HL2 not passing through the first optical area DA1 may have different shapes or lengths.

In addition, to improve the transmittance of the first optical area DA1, the first vertical lines VL1 passing through the first optical area DA1 may pass through the first optical area DA1 while avoiding the first transmissive areas TA1 within the first optical area DA1. Thus, each of the first vertical lines VL1 passing through the first optical area DA1 may include a curved section or a bending section that extends outside the outer edge of each first transmissive area TA1. The first vertical lines VL1 passing through the first optical area DA1 and the normal vertical lines VLn disposed in the normal area NA without passing through the first optical area DA1 may have different shapes or lengths.

Referring to FIG. 5A, the first transmissive areas TA1 included in the first optical area DA1 in the first horizontal area HA1 may be arranged in an oblique direction.

Referring to FIG. 5A, in the first optical area DA1 in the first horizontal area HA1, the emission areas may be disposed between two first transmissive areas TA1 adjacent to each other. In the first optical area DA1 in the first horizontal area HA1, the emission areas may be disposed between two first transmissive areas that are vertically adjacent to each other.

Referring to FIGS. 4 and 5B, the second optical area DA2 included in the first horizontal area HA1 may include the emission areas EA and the second transmissive areas TA2. Within the second optical area DA2, an area outside the second transmissive area TA2 may include the emission areas EA.

As illustrated in FIG. 5B, positions and arrangements of the emission areas EA and the second transmissive areas TA2 in the second optical area DA2 may be different from positions and arrangements of the emission areas EA and the first transmissive areas TA1 in the first optical area DA1 in FIG. 5A. However, the positions and arrangements of the emission areas EA and the second transmissive areas TA2 in the second optical area DA2 may be identical to the positions and arrangements of the emission areas EA and the first transmissive areas TA1 in the first optical area DA1 in FIG. 5A.

Referring to FIG. 5B, within the second optical area DA2, the second transmissive areas TA2 may be disposed in the horizontal direction (a lateral direction), and the emission areas EA may not be disposed between the two second transmissive areas TA2 adjacent in the horizontal direction (the lateral direction). Also, within the second optical area DA2, the second transmissive areas TA2 may be disposed in a longitudinal direction (the vertical direction), and the emission areas EA may be disposed between the second transmissive areas TA2 adjacent in the longitudinal direction (the vertical direction). That is, the emission areas EA may be disposed between two rows of the second transmissive areas TA2.

The positions and arrangements of the emission areas EA and the second transmissive areas TA2 in the second optical area DA2 in FIG. 5B are different from the positions and arrangements of the emission areas EA and the first transmissive areas TA1 in the first optical area DA1 in FIG. 5A. Therefore, as illustrated in FIG. 5B, when the first horizontal lines HL1 pass through the second optical area DA2 in the first horizontal area HA1 and the normal area around the second optical area DA2, the first horizontal lines HL1 may pass the areas in a form different from that in FIG. 5A. However, when the first horizontal lines HL1 pass through the second optical area DA2 in the first horizontal area HA1 and the normal area around the second optical area DA2, the first horizontal lines HL1 may pass the areas in the same form as that in FIG. 5A.

Referring to FIG. 5B, when the first horizontal line HL1 passes through the second optical area DA2 in the first horizontal area HA1 and the normal area NA around the second optical area DA2, the first horizontal line HL1 may pass linearly between the vertically adjacent second transmissive areas TA2, without having a curved section or a bending section.

For example, one first horizontal line HL1 may have a curved section or bending section in the first optical area DA1, but may not have a curved section or bending section in the second optical area DA2.

In addition, to improve the transmittance of the second optical area DA2, the second vertical lines VL2 passing through the second optical area DA2 may pass through the second optical area DA2 while avoiding the second transmissive areas TA2 within the second optical area DA2. As illustrated in FIG. 5B, each of the second vertical lines VL2 passing through the second optical area DA2 may include a curved section or a bending section that extends outside an outer edge of each second transmissive area TA2. Accordingly, the second vertical lines VL2 passing through the second optical area DA2 and the normal vertical lines VLn disposed in the normal area without passing through the second optical area DA2 may have different shapes or lengths.

When the first horizontal lines HL1 passing through the first optical area DA1 have curved sections or bending sections that detour outside the outer edges of the first transmissive areas TA1, the first horizontal lines HL1 passing through the first optical area DA1 and the second optical area DA2 may be longer than the second horizontal lines HL2 disposed only in the normal area EA.

Accordingly, a resistance of the first horizontal lines HL1 passing through the first optical area DA1 and the second optical area DA2 (hereinafter referred to as 'first resistance') may be greater than a resistance of the second horizontal lines HL2 disposed only in the normal area NA (hereinafter referred to as 'second resistance').

The first optical area DA1 overlapping the first optical electronic device 170*a* at least in part includes a plurality of the first transmissive areas TA1 and the second optical area DA2 overlapping the second optical electronic device 170*b* at least in part includes a plurality of the second transmissive areas TA2. Thus, a number of sub-pixels to which the first horizontal lines HL1 passing through the first optical area DA1 and the second optical area DA2 are connected may be different from the number of the sub-pixels to which the second horizontal lines HL2 disposed only in the normal area NA without passing through the first optical area DA1 and the second optical area DA2 are connected.

That is, the first optical area DA1 and the second optical area DA2 may have fewer sub-pixels per unit area than the normal area NA.

The number (first number) of the sub-pixels to which the first horizontal lines HL1 passing through the first optical area DA1 and the second optical area DA2 are connected may be fewer than the number (second number) of the sub-pixels to which the second horizontal lines HL2 disposed only in the normal area NA are connected.

A difference between the first number and the second number may vary according to a difference between resolution of each of the first optical area DA1 and the second optical area DA2 and resolution of the normal area NA. For example, as the difference between the resolution of each of the first optical area DA1 and the second optical area DA2 and the resolution of the normal area NA increases, the difference between the first number and the second number may increase.

As described above, since the first number of sub-pixels to which the first horizontal lines HL1 passing through the first optical area DA1 and the second optical area DA2 are connected is fewer than the second number of sub-pixels to which the second horizontal lines HL2 disposed only in the normal area NA are connected, an area where the first horizontal lines HL1 overlap surrounding electrodes or lines may be smaller than an area where the second horizontal lines HL2 overlap surrounding electrodes or lines.

Therefore, a parasitic capacitance formed between the first horizontal line HL1 and surrounding electrodes or lines (hereinafter referred to as 'first capacitance') may be significantly less than a parasitic capacitance formed between the second horizontal line HL2 and surrounding electrodes or lines (hereinafter referred to as 'second capacitance').

Considering magnitude relationship between the first resistance and the second resistance (first resistance≥second resistance) and magnitude relationship between the first capacitance and the second capacitance (first capacitance<<second capacitance), a resistance-capacitance (RC) value (hereinafter, referred to as 'a first RC value') of the first horizontal line HL1 passing through the first optical area DA1 and the second optical area DA2 may be relatively much smaller or less than an RC value (hereinafter referred to as 'second RC value') of the second horizontal line HL2 disposed only in the normal area NA without passing through the first optical area DA1 and the second optical area DA2 (i.e., first RC value<<second RC value).

Due to a difference between the first RC value of the first horizontal line HL1 and the second RC value of the second horizontal line HL2 (hereinafter, referred to as 'RC load difference'), signal transmission characteristics through the first horizontal line HL1 may be different from signal transmission characteristics through the second horizontal line HL2.

Hereinafter, a cross-sectional structure of the normal area NA of the display apparatus 100 according to an example of the present disclosure will be described in detail with reference to FIG. 6.

Figure 6:
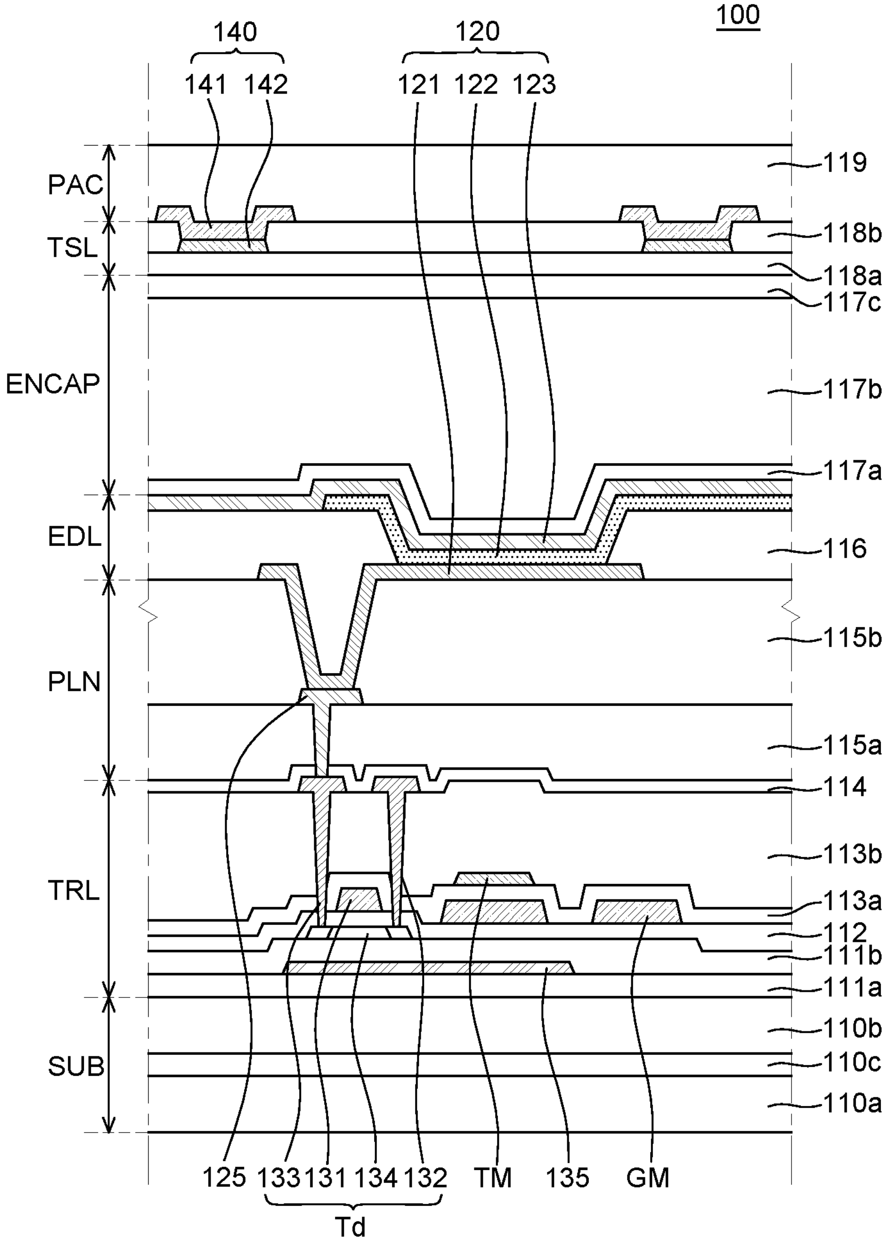
FIG. 6 is a view illustrating a cross-sectional structure of one pixel disposed in the normal area according to an example of the present disclosure.

FIG. 6 is a view illustrating a cross-sectional structure of one pixel disposed in the normal area according to an example of the present disclosure.

In the normal area NA, a transistor layer TRL may be disposed on the substrate SUB, and a planarization layer PLN may be disposed on the transistor layer TRL. A light emitting element layer EDL may be disposed on the planarization layer PLN, the encapsulation layer ENCAP may be disposed on the light emitting element layer EDL, a touch sensing layer TSL may be disposed on the encapsulation layer ENCAP, and a protective layer PAC may be disposed on the touch sensing layer TSL. Although not illustrated in FIG. 6, an organic material layer may be disposed on the protective layer PAC, and a polarization layer may be disposed on the organic material layer.

The substrate SUB is a component for supporting various components included in the display apparatus 100 and may be formed of an insulating material. The substrate SUB may include a first substrate 110*a*, a second substrate 110*b*, and an interlayer insulating layer 110*c*. For example, the first substrate 110*a* and the second substrate 110*b* may be polyimide (PI) substrates. The interlayer insulating layer 110*c* may be disposed between the first substrate 110*a* and the second substrate 110*b*. In this manner, since the substrate SUB is configured to include the first substrate 110*a*, the second substrate 110*b*, and the interlayer insulating layer 110*c*, moisture permeation can be prevented.

In the transistor layer TRL in the normal area NA, various patterns (e.g., 131, 132, 133, and 134) for forming transistors such as a driving transistor Td and the like, various insulating layers (e.g., 111*a*, 111*b*, 112, 113*a*, 113*b*, and 114) and various metal patterns TM, GM, and 135 may be disposed.

Hereinafter, a stacked structure of the transistor layer TRL will be described in more detail.

A multi-buffer layer 111*a* may be disposed on the second substrate 110*b*, and a metal layer 135 may be disposed on the multi-buffer layer 111*a*. Here, the metal layer 135 may serve as a light shield element and may also be referred to as a light blocking layer.

An active buffer layer 111*b* may be disposed on the multi-buffer layer 111*a* and the metal layer 135, and an active layer 134 of the driving transistor Td may be disposed on the active buffer layer 111*b*. For example, the active layer 134 may be formed of polysilicon (p-Si), amorphous silicon (a-Si), or an oxide semiconductor, but the present disclosure is not limited thereto.

A gate insulating layer 112 may be disposed on the active layer 134. The gate insulating layer 112 may be formed of silicon oxide (SiOx), silicon nitride (SiNx), or a double layer thereof.

In addition, a gate electrode 131 of the driving transistor Td may be disposed on the gate insulating layer 112. The gate electrode 131 is disposed to overlap the active layer 134 on the gate insulating layer 112. The gate electrode 131 may be formed of various conductive materials, such as magnesium (Mg), aluminum (Al), nickel (Ni), chromium (Cr), molybdenum (Mo), tungsten (W), gold (Au), or alloys thereof, but the present disclosure is not limited thereto.

A gate material layer GM may be disposed on the gate insulating layer 112 at a location different from a location where the driving transistor Td is formed.

A first interlayer insulating layer 113*a* may be disposed on the gate electrode 131 and the gate material layer GM. A metal pattern TM may be disposed on the first interlayer insulating layer 113*a*. A second interlayer insulating layer 113*b* may be disposed while covering the metal pattern TM disposed on the first interlayer insulating layer 113*a*.

A source electrode 132 and a drain electrode 133 of the driving transistor Td may be disposed on the second interlayer insulating layer 113*b*.

The source electrode 132 and the drain electrode 133 may be connected to or disposed on one side and the other side of (the top surface of) the active layer 134, respectively, through contact holes provided in the second interlayer insulating layer 113*b*, the first interlayer insulating layer 113*a*, and the gate insulating layer 112. The source electrode 132 and the drain electrode 133 may be formed of various conductive materials, such as magnesium (Mg), aluminum (Al), nickel (Ni), chromium (Cr), molybdenum (Mo), tungsten (W), gold (Au) or an alloy thereof, but the present disclosure is not limited thereto.

A portion of the active layer 134 overlapping the gate electrode 131 is a channel region. One of the source electrodes 132 and the drain electrode 133 is connected to one side of the channel region in the active layer 134 and the other thereof is connected to the other side of the channel region in the active layer 134.

A passivation layer 114 may be disposed on the source electrode 132 and the drain electrode 133. The passivation layer 114 is to protect the driving transistor Td, and may be formed of an inorganic film, for example, silicon oxide (SiOx), silicon nitride (SiNx), or a double layer thereof.

The planarization layer PLN may be located on the transistor layer TRL. The planarization layer PLN may include a first planarization layer 115*a* and a second planarization layer 115*b*. The planarization layer PLN protects the driving transistor Td and planarizes an upper portion thereof. The first planarization layer 115*a* may be disposed on the passivation layer 114, and a connection electrode 125 may be disposed on the first planarization layer 115*a*.

The connection electrode 125 may be connected to one of the source electrodes 132 and the drain electrode 133 through a contact hole provided in the first planarization layer 115*a*.

The second planarization layer 115*b* may be disposed on the connection electrode 125.

The light emitting element layer EDL may be located on the second planarization layer 115*b*.

Hereinafter, a stacked structure of the light emitting element layer EDL will be described in detail.

A light emitting element 120 including an anode 121, a light emitting layer 122, and a cathode 123 may be formed on the second planarization layer 115*b*.

The anode 121 may be disposed on the second planarization layer 115*b*. In this case, the anode 121 may be electrically connected to the connection electrode 125 through a contact hole provided in the second planarization layer 115*b*. The anode 121 may be formed of a metal material.

When the display apparatus 100 is a top emission type in which light emitted from the light emitting element 120 is emitted upwardly of the substrate SUB on which the light emitting element 120 is disposed, the anode 121 may further include a transparent conductive layer and a reflective layer on the transparent conductive layer. The transparent conductive layer may be formed of, for example, a transparent conductive oxide such as ITO or IZO, and the reflective layer may be formed of, for example, silver (Ag), aluminum (Al), gold (Au), molybdenum (Mo), tungsten (W), chromium (Cr), or alloys thereof.

A bank 116 may be disposed to cover the anode 121. In this case, a portion of the bank 116 corresponding to the emission area of the sub-pixel may be opened to form a hole or open area. The portion of the anode 121 may be exposed to an open area where the bank 116 is opened. The bank 116 may be formed of an inorganic insulating material, such as silicon nitride (SiNx) or silicon oxide (SiOx) or an organic insulating material, such as benzocyclobutene-based resin, acrylic-based resin, or imide-based resin, but the present disclosure is not limited thereto.

The light emitting layer 122 may be disposed in the open area of the bank 116 and a peripheral portion thereof. That is, the light emitting layer 122 may be disposed on the anode 121 exposed through the open area of the bank 116. The light emitting layer 122 may include a plurality of organic layers.

The cathode 123 may be disposed on the light emitting layer 122.

The encapsulation layer ENCAP may be located on the light emitting element layer EDL described above.

The encapsulation layer ENCAP may have a single layer structure or a multilayer structure. For example, the encapsulation layer ENCAP may include a first encapsulation layer 117*a*, a second encapsulation layer 117*b*, and a third encapsulation layer 117*c*.

In this case, the first encapsulation layer 117*a* and the third encapsulation layer 117*c* may be formed of an inorganic film, and the second encapsulation layer 117*b* may be formed of an organic film. Among the first encapsulation layer 117*a*, the second encapsulation layer 117*b*, and the third encapsulation layer 117*c*, the second encapsulation layer 117*b* may be the thickest and may serve as a planarization layer. The second encapsulation layer 117*b* may be thicker than each of the first encapsulation layer 117*a* and the third encapsulation layer 117*c*.

The first encapsulation layer 117*a* may be disposed on the cathode 123 and may be disposed closest to the light emitting element 120. The first encapsulation layer 117*a* may be formed of an inorganic insulating material capable of low-temperature deposition. For example, the first encapsulation layer 117*a* may be formed of silicon nitride (SiNx), silicon oxide (SiOx), silicon oxynitride (SiON), or aluminum oxide ($Al_2O_3$). Since the first encapsulation layer 117*a* is deposited in a low-temperature atmosphere, it is possible to prevent damage to the light emitting layer 122 including an organic material vulnerable to a high-temperature atmosphere during a deposition process.

The second encapsulation layer 117*b* may have an area smaller than the first encapsulation layer 117*a*. In this case, the second encapsulation layer 117*b* may be formed to expose both ends of the first encapsulation layer 117*a*. The second encapsulation layer 117*b* may serve as a buffer to alleviate stress between the respective layers due to bending of the flexible display apparatus and to serve to enhance planarization performance.

For example, the second encapsulation layer 117*b* may be formed of an organic insulating material, such as acrylic resin, epoxy resin, polyimide, polyethylene, or silicon oxycarbon (SiOC). For example, the second encapsulation layer 117*b* may be formed through an inkjet method, but the present disclosure is not limited thereto.

The third encapsulation layer 117*c* may be formed to cover an upper surface and/or side surfaces of each of the second encapsulation layer 117*b* and the first encapsulation layer 117*a* above the substrate SUB above which the second encapsulation layer 117*b* is formed. In this case, the third encapsulation layer 117*c* may minimize or block penetration of external moisture or oxygen into the first encapsulation layer 117*a* and the second encapsulation layer 117*b*. For example, the third encapsulation layer 117*c* may be formed of an inorganic insulating material, such as silicon nitride (SiNx), silicon oxide (SiOx), silicon oxynitride (SiON), or aluminum oxide ($Al_2O_3$).

Although not illustrated in FIG. 6, a color filter may be disposed on the encapsulation layer ENCAP, but the present disclosure is not limited thereto.

The touch sensing layer TSL may be disposed on the encapsulation layer ENCAP described above.

A touch buffer layer 118*a* may be disposed on the encapsulation layer ENCAP, and a touch line 140 may be disposed on the touch buffer layer 118*a*.

The touch line 140 may include a touch sensor metal 141 and a bridge metal 142 located on different layers. A touch interlayer insulating layer 118*b* may be disposed between the touch sensor metal 141 and the bridge metal 142 or at least some of the side surfaces of the touch sensor metal 141 and the bridge metal 142.

For example, the touch sensor metal 141 may include a first touch sensor metal, a second touch sensor metal, and a third touch sensor metal disposed adjacent to one another. The first touch sensor metal and the second touch sensor metal are electrically connected to each other, but when the third touch sensor metal is present between the first touch sensor metal and the second touch sensor metal, the first touch sensor metal and the second touch sensor metal may be electrically connected through the bridge metal 142 disposed on a different layer therefrom. The bridge metal 142 may be insulated from the third touch sensor metal by the touch interlayer insulating layer 118*b*.

When the touch sensing layer TSL is formed, a chemical solution (a developer or etching solution) used in the process or moisture from the outside may be generated. Therefore, by disposing the touch buffer layer 118*a* and then disposing the touch sensing layer TSL or the touch interlayer insulating layer 118*b* thereon, it is possible to prevent penetration of the chemical solution or moisture into the light emitting layer 122 including an organic material during manufacturing of the touch sensing layer TSL.

As such, the touch buffer layer 118*a* can prevent damage to the light emitting layer 122, which is vulnerable to the chemical solution or moisture. The touch buffer layer 118*a* may be formed of an organic insulation material capable of being formed at a low temperature of a certain temperature (e.g., 100° C.) or less and having a low dielectric permittivity of 1 to 3 in order to prevent damage to the light emitting layer 122 including an organic material vulnerable to high temperature. For example, the touch buffer layer 118*a* may be formed of an acryl-based material, an epoxy-based material, or a siloxane-based material.

The display apparatus 100 according to an example of the present disclosure may be a flexible display apparatus, and the encapsulation layer ENCAP may be damaged as the flexible display apparatus is bent. In this case, the touch sensor metal 141 located above the touch buffer layer 118*a* may be broken. Accordingly, the touch buffer layer 118*a* according to an example of the present disclosure may be formed of an organic insulating material and have planarization performance, thereby preventing damage to the encapsulation layer ENCAP and breakage of the metals 141 and 142 constituting the touch line 140 even when the flexible display apparatus is bent.

A protective layer (PAC) 119 may be disposed to cover the touch line 140. The protective layer 119 may be formed of an organic insulating layer.

Although not illustrated in FIG. 6, the polarization layer may be disposed on the organic material layer. The polarization layer suppresses reflection of external light on the display area DA of the substrate SUB. When the display apparatus 100 is used outside, external natural light may be introduced and reflected by the reflective layer included in the anode 121 of the light emitting element, or reflected by the electrode formed of a metal disposed in a lower portion of the light emitting element 120. An image of the display apparatus 100 may not be viewed due to the reflected light. The polarization layer polarizes light introduced from the outside in a specific direction and prevents the reflected light from being emitted to the outside of the display apparatus 100 again.

Also, although not illustrated in FIG. 6, a cover glass may be bonded to the polarization layer by an adhesive layer. The adhesive layer may serve to bond the respective components of the display apparatus 100 to each other and may be formed using an optically transparent display adhesive such as a pressure-sensitive adhesive, an optical clear adhesive (OCR), or an optical clear resin (OCR). However, the present disclosure is not limited thereto. The cover glass may protect components of the display apparatus 100 from external impacts and prevent the occurrence of damage such as scratches or the like.

Referring to FIGS. 7 to 12B, the optical area of the display apparatus 100 according to an example of the present disclosure will be described in detail.

Hereinafter, for convenience of explanation, a case in which the display area DA includes the normal area NA and the first optical area DA1 in the display panel DP of the display apparatus 100 (i.e., FIGS. 1A and 1B) will be described as an example, but descriptions of the first optical area DA1 can be equally applied to the second optical area DA2.

Figure 7:
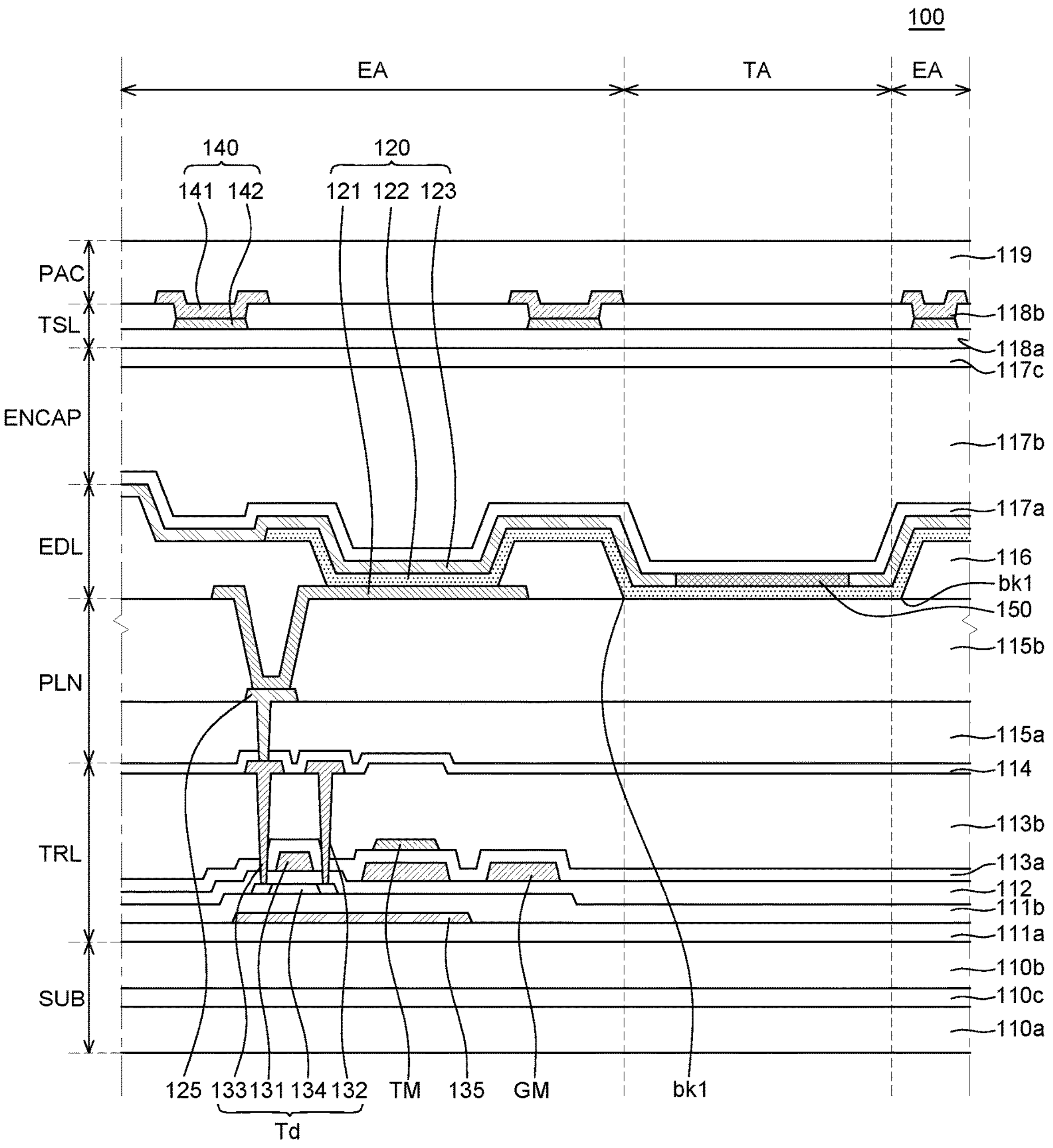
FIG. 7 is a view illustrating a cross-sectional structure of an emission area and a transmissive area of the optical area according to an example of the present disclosure.

FIG. 7 is a view illustrating a cross-sectional structure of the emission area and the transmissive area of the optical area according to an example of the present disclosure.

Referring to FIG. 7, the first optical area DA1 includes the emission area EA and the transmissive area TA.

Each of the emission area EA and the transmissive area TA in the first optical area DA1 may include the substrate SUB, the transistor layer TRL, the planarization layer PLN, the light emitting element layer EDL, the encapsulation layer ENCAP, the touch sensing layer TSL, and the protective layer PAC of, for example, FIG. 6.

Since the substrate SUB, the transistor layer TRL, the planarization layer PLN, the light emitting element layer EDL, the encapsulation layer ENCAP, the touch sensing layer TSL, and the protective layer PAC included in the first optical area DA1 are substantially identical to the components of the same reference numerals disposed in the normal area NA of the display panel DP described above with reference to FIG. 6, redundant descriptions will be omitted. In addition, since a structure of the emission area EA in the first optical area DA1 is substantially identical to that of the normal area NA of the display panel DP, redundant descriptions will be omitted. Also, although not illustrated in FIG. 7, the optical electronic device 170 may be disposed under the substrate SUB in the first optical area DA1.

Hereinafter, the transmissive area TA disposed in the first optical area DA1 will be described.

The substrate SUB and various insulating layers (e.g., 111*a*, 111*b*, 112, 113*a*, 113*b*, 114, 115*a*, 115*b*, 117*a*, 117*b*, 117*c*, and PAC) that are disposed in the emission area EA of the first optical area DA1 may also be disposed in the transmissive area TA of the first optical area DA1 in the same manner.

However, except for the insulating material disposed in the emission area EA of the first optical area DA1, a material layer having electrical characteristics or opaque characteristics may not be disposed in the transmissive area TA of the first optical area DA1.

For example, the metal material layers (e.g., 135, 131, GM, TM, 132, 133, and 125) related to the transistors and the semiconductor layer 134 are not disposed in the transmissive area TA. The anode 121 included in the light emitting element 120 may not be disposed in the transmissive area TA, the cathode 123 may not be disposed in the transmissive area TA except for a partial area adjacent to the emission area EA, and the light emitting layer 122 may be disposed or may not be disposed in the transmissive area TA. The touch sensor metal 141 and the bridge metal 142 included in the touch sensor are not disposed in the transmissive area TA.

Since the transmissive area TA in the first optical area DA1 overlaps the optical electronic device 170, a transmittance of the transmissive area TA allowing for a normal operation of the optical electronic device 170 should be secured. According to an example of the present disclosure, the cathode 123 is not disposed in the transmissive area TA to secure the transmittance of the transmissive area TA.

To implement this, the deposition blocking layer 150 is disposed on the planarization layer 115*b* and the emission layer 122 of the transmissive area TA.

The deposition blocking layer 150 may be formed of an organic material. The organic material for the deposition blocking layer 150 may be a material that can be patterned using a fine metal mask and/or may be a material that cannot be patterned through an exposure etching process. That is, the organic material for the deposition blocking layer 150 may be a different material from organic insulating materials such as photoacry and polyimide used for a gate insulating layer 112, an interlayer insulating layer 110*c*, and a protective layer 119. Also, the organic material for the deposition blocking layer 150 may be a different material from an inorganic insulating material such as silicon nitride (SiNx), silicon oxide (SiOx), or silicon oxynitride (SiON). The deposition blocking layer 150 may perform a function of preventing deposition of the cathode 123. That is, the cathode 123 may not be deposited in an area where the deposition blocking layer 150 is formed. The deposition blocking layer 150 may be formed of an organic material having a relatively low surface energy and/or a relatively low glass transition temperature. The deposition blocking layer 150 may allow the cathode 123 to be desorbed from the upper portion of the deposition blocking layer 150 without being adsorbed upon formation of the cathode 123.

For example, the deposition blocking layer 150 may be deposited using a fine metal mask (FMM) to correspond to the transmissive area TA. Specifically, after positioning the FMM to expose the transmissive area TA, the deposition blocking layer 150 may be formed.

When the cathode 123 is deposited after disposing the deposition blocking layer 150 on the light emitting layer 122 in the transmissive area TA, since the deposition blocking layer 150 has low adhesive strength with the layer disposed thereon, the cathode 123 may not be deposited in the area where the deposition blocking layer 150 is disposed. That is, the deposition blocking layer 150 and the cathode 123 do not overlap each other.

In addition, the metal material layers (e.g., 135, 131, GM, TM, 132, 133, and 125) related to the transistors and the semiconductor layer 134 are not disposed in the transmissive area TA. Also, the anode 121 included in the light emitting element 120 may not be disposed in the transmissive area TA. Also, the touch line may not be disposed in the transmissive area TA.

That is, since the transmissive area TA of the first optical area DA1 overlaps the optical electronic device 170, the transmittance of the transmissive area TA may be increased by not disposing an opaque component such as a metal electrode in the transmissive area TA for a normal operation of the optical electronic device 170.

In addition, since a component such as a metal electrode is not disposed in the transmissive area TA of the first optical area DA1, the transmissive area TA of the first optical area DA1 may be formed of only a flat (or uniform) layer.

Meanwhile, when the display apparatus 100 is a UDC model or an under-display IR (infrared ray) sensor (UDIR) model, UV reliability may be lowered in a case where the cathode 123 is removed to secure the transmittance of the transmissive area TA. That is, a pixel shrinkage defect of a light emitting unit may be caused by outgassing of the organic material such as the bank due to transmission of UV light in the transmissive area TA. When the bank is heated during manufacturing, the bank may exhibit outgassing to the display apparatus, and when the bank is removed, the possibility of outgassing is reduced.

Therefore, according to an example of the present disclosure, by removing a portion of the organic material in the transmissive area TA to reduce a volume of the organic material, it is possible to suppress outgassing of the organic material due to transmission of UV light.

According to an example of the present disclosure, a lower surface of the light emitting layer 122 may contact the planarization layer PLN in the transmissive area TA of the first optical area DA1. That is, the bank 116 may not be disposed in the transmissive area TA. Accordingly, the volume of the organic material disposed in the transmissive area TA may be reduced.

For example, when the volume of the organic material, such as the bank is reduced in the transmissive area, the deposition blocking layer to be disposed in the transmissive area later may be disposed on a side surface of the bank as well as an upper portion of the light emitting layer. The deposition blocking layer has low adhesive strength with a layer disposed over or below the deposition blocking layer. Thus, when there is a step under the deposition blocking layer, film delamination due to the step may occur. In other words, if the upper surface of a layer positioned below the deposition blocking layer 150 is not flat, the deposition blocking layer 150 may not be completely adhered to the layer positioned below the deposition blocking layer 150 and may be lifted, this lifting is known as film delamination. In addition, if the deposition blocking layer 150 is not flat (or uneven), it might be thinner in some parts of the layer. Where the deposition blocking layer 150 is thinner, it may not be a good or useful blocking layer.

Accordingly, according to an example of the present disclosure, the deposition blocking layer 150 may be disposed on a flat surface in the optical area DA1. That is, according to an example of the present disclosure, a lower portion of the deposition blocking layer 150 in the optical area DA1 may be flat, and the deposition blocking layer 150 may not overlap the bank 116.

Meanwhile, as the deposition blocking layer 150 is disposed, when the cathode 123 is subsequently deposited, the cathode 123 is not disposed on an upper portion of the deposition blocking layer 150. That is, the cathode 123 may be disposed only in the emission area EA and in a portion of the transmissive area TA where the deposition blocking layer 150 is not disposed, in the optical area DA1. A side surface of the cathode 123 that is disposed to extend from the emission area EA to a partial area of the transmissive area TA and a side surface of the deposition blocking layer 150 that is disposed in the transmissive area TA of the optical area DA1 may contact each other. However, the present disclosure is not limited thereto.

Figure 8A:
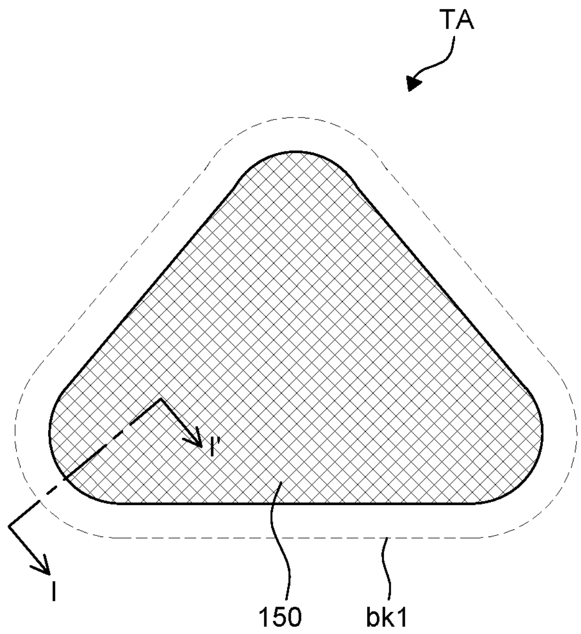
FIG. 8A is a plan view schematically illustrating an example of a positional relationship between a deposition blocking layer in the transmissive area and an end portion of a back in the emission area according to an example of the present disclosure.
Figure 8B:
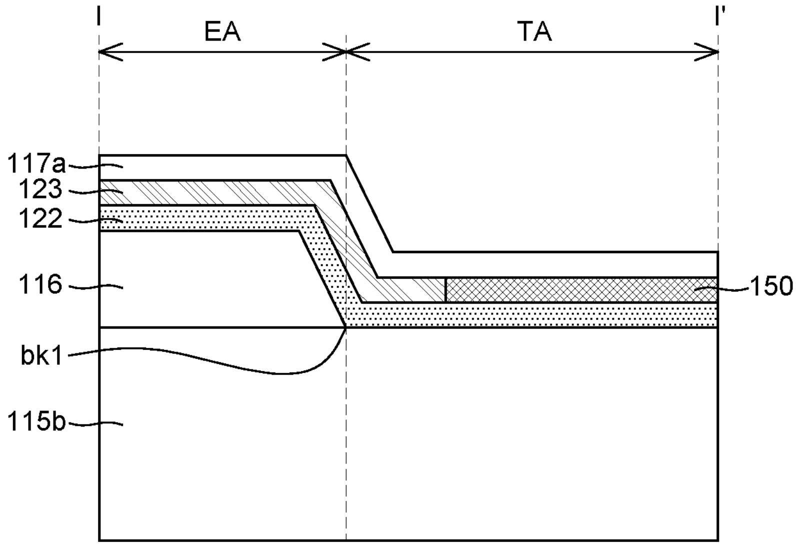
FIG. 8B is an enlarged cross-sectional view of the emission area and the transmissive area taken along I-I' of FIG. 8A, according to an example of the present disclosure.

FIG. 8A is a plan view schematically illustrating an example of a positional relationship between a deposition blocking layer in the transmissive area and an end portion of the bank in the emission area according to an example of the present disclosure. FIG. 8B is an enlarged cross-sectional view of the emission area and the transmissive area taken along I-I' of FIG. 8A, according to an example of the present disclosure.

Referring to FIGS. 8A and 8B, an end portion bk1 of the bank 116 disposed in the emission area EA and the deposition blocking layer 150 disposed in the transmissive area TA may be spaced apart from each other by a predetermined distance. The predetermined distance may refer to a distance that is sufficiently spaced apart from the end of the bank so as not to overlap with the slope-shaped bank during deposition of the deposition blocking layer 150. The predetermined distance may change depending on the size of the display device. The transmissive area TA may be defined as an area bounded by the end portion bk1 of the bank 116 that is continuous. In this case, the bank 116 may be continuous across the whole display device apart from the transmissive area TA. Therefore, as illustrated in FIG. 8A, an area of the transmissive area TA and an area of the deposition blocking layer 150 are different from each other, and the area of the deposition blocking layer 150 may be smaller than the area of the transmissive area TA. In this case, a thickness of the deposition blocking layer 150 may be constant.

To this end, in the display apparatus 100 according to an example of the present disclosure, when the deposition blocking layer 150 is formed, the deposition blocking layer 150 is deposited using the FMM. In this case, the FMM may be disposed to overlap a portion of a flat surface in the transmissive area TA in consideration of a process margin, and an area of the FMM to form the deposition blocking layer 150 may be set to be smaller than that of the transmissive area TA by a predetermined size. For example, by making the area of the FMM less than 95% of the area of the transmissive area TA, the deposition blocking layer 150 may also be formed to have an area of less than 95% of the area of the transmissive area TA. As described above, as the area of the deposition blocking layer 150 is formed to be 95% or less of the area of the transmissive area TA, side portions of the deposition blocking layer 150 may be spaced apart from the end portion bk1 of the bank 116 disposed in the emission area EA.

As illustrated in FIG. 8A, the deposition blocking layer 150 may have a shape including a plurality of the side portions and a plurality of corner portions connecting the plurality of side portions on a plane. In FIG. 8A, it is exemplified that a distance between the plurality of corners of the deposition blocking layer 150 and the end portion bk1 of the bank 116 is equal to a distance between the plurality of side portions of the deposition blocking layer 150 and the end portion bk1 of the bank 116.

As such, since the deposition blocking layer 150 is disposed in an area of the transmissive area TA, an opaque electrode such as the cathode 123 is not disposed in the transmissive area TA, and an improvement in transmittance can be allowed. In addition, since the deposition blocking layer 150 is not formed along a side surface of the bank 116, it is possible to prevent film delamination due to an arrangement of the deposition blocking layer 150.

Figure 9A:
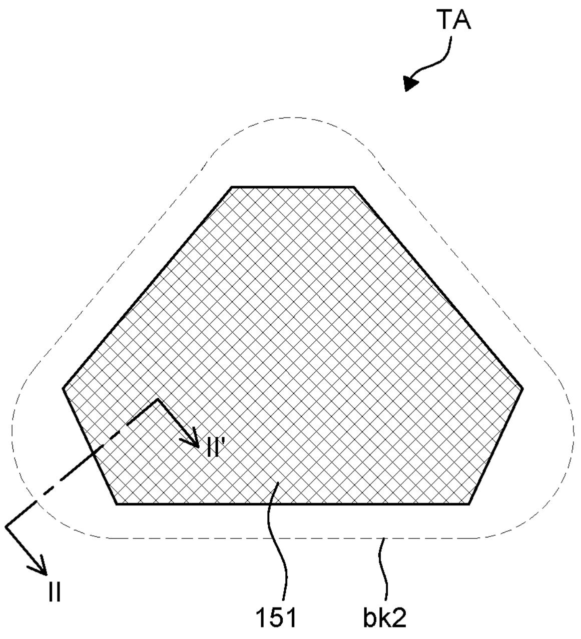
FIG. 9A is a plan view schematically illustrating another example of a positional relationship between a deposition blocking layer in the transmissive area and an end portion of the bank in the emission area according to an example of the present disclosure.
Figure 9B:
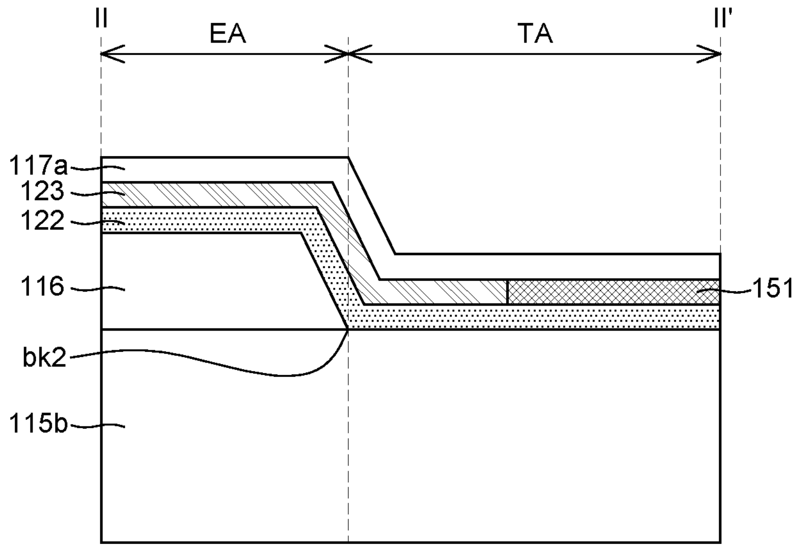
FIG. 9B is an enlarged cross-sectional view of the emission area and the transmissive area taken along II-II' of FIG. 9A, according to an example of the present disclosure.

FIG. 9A is a plan view schematically illustrating another example of a positional relationship between a deposition blocking layer in the transmissive area and an end portion of the bank in the emission area according to an example of the present disclosure. FIG. 9B is an enlarged cross-sectional view of the emission area and the transmissive area taken along II-II' of FIG. 9A, according to an example of the present disclosure.

Referring to FIGS. 9A and 9B, an end portion bk2 of the bank 116 disposed in the emission area EA and side portions of a deposition blocking layer 151 disposed in the transmissive area TA are spaced apart by a predetermined distance, and corner portions of the deposition blocking layer 151 may be further spaced apart from the end portion bk2 of the bank 116, compared to the side portions thereof.

That is, in FIG. 9A, it is exemplified that a distance between at least one of a plurality of the corner portions of the deposition blocking layer 151 and the end portion bk2 of the bank 116 is greater than a distance between a plurality of the side portions and the end portion bk2 of the bank 116.

Through this, stress on the corner portion of the deposition blocking layer 151 is alleviated while the deposition blocking layer 151 is not formed along the side surface of the bank 116, so that an effect of preventing film delamination defects may be improved.

Figure 10A:
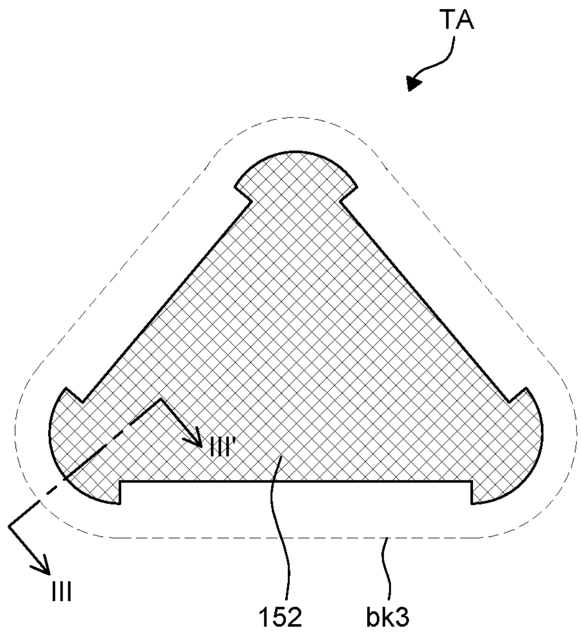
FIG. 10A is a plan view schematically illustrating still another example of a positional relationship between a deposition blocking layer in the transmissive area and an end portion of the bank in the emission area according to an example of the present disclosure.
Figure 10B:
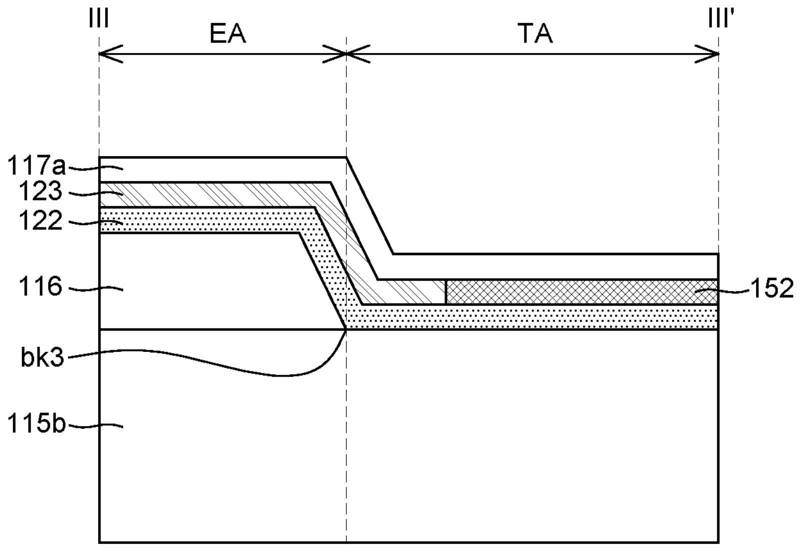
FIG. 10B is an enlarged cross-sectional view of the emission area and the transmissive area taken along III-III' of FIG. 10A, according to an example of the present disclosure.

FIG. 10A is a plan view schematically illustrating still another example of a positional relationship between a deposition blocking layer in the transmissive area and an end portion of the bank in the emission area according to an example of the present disclosure. FIG. 10B is an enlarged cross-sectional view of the emission area and the transmissive area taken along III-III' of FIG. 10A, according to an example of the present disclosure.

Referring to FIGS. 10A and 10B, an end portion bk3 of the bank 116 disposed in the emission area EA and side portions of a deposition blocking layer 152 disposed in the transmissive area TA are spaced apart from each other by a predetermined distance, and corner portions of the deposition blocking layer 152 may be further spaced apart from the end portion bk3 of the bank 116, compared to the side portions thereof.

That is, in FIG. 10A, it is exemplified that a distance between at least one of a plurality of the side portions of the deposition blocking layer 152 and the end portion bk3 of the bank 116 is greater than a distance between a plurality of the corner portions and the end portion bk3 of the bank 116.

Through this, stress on the side portion of the deposition blocking layer 152 is alleviated while the deposition blocking layer 152 is not formed along the side surface of the bank 116, so that an effect of preventing film delamination defects may be improved. In any case, it may be preferable to implement an embodiment with a simplified structure for simplified manufacture.

Figure 11A:
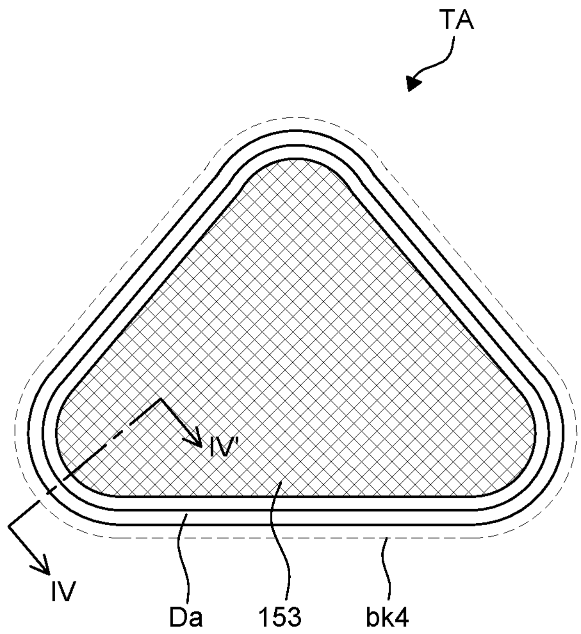
FIG. 11A is a plan view schematically illustrating still another example of a positional relationship between a deposition blocking layer in the transmissive area and an end portion of the bank in the emission area according to an example of the present disclosure.

FIG. 11A is a plan view schematically illustrating still another example of a positional relationship between a deposition blocking layer in the transmissive area and an end portion of the bank in the emission area according to an example of the present disclosure.

Figure 11B:
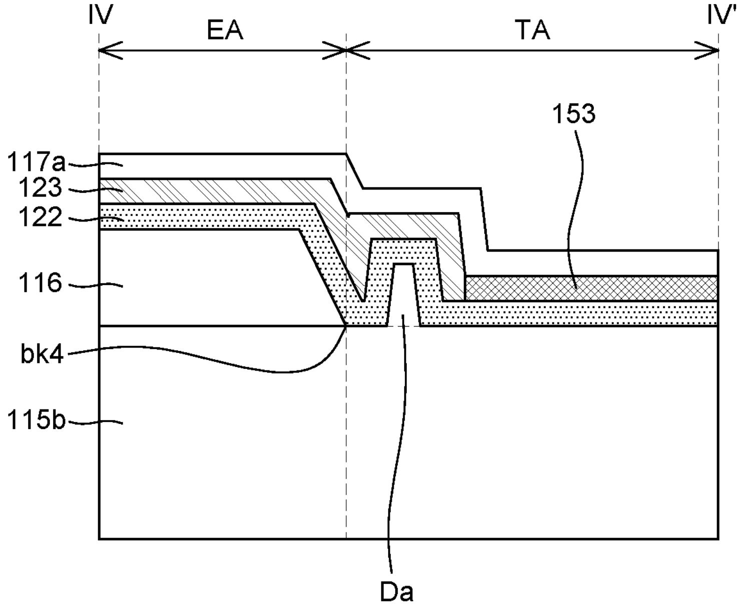
FIG. 11B is an enlarged cross-sectional view of the emission area and the transmissive area taken along IV-IV' of FIG. 11A. according to an example of the present disclosure.

FIG. 11B is an enlarged cross-sectional view of the emission area and the transmissive area taken along IV-IV' of FIG. 11A, according to an example of the present disclosure.

Referring to FIGS. 11A and 11B, an end portion bk4 of the bank 116 disposed in the emission area EA and side portions of a deposition blocking layer 153 disposed in the transmissive area TA are spaced apart by a predetermined distance, and at least one structure Da may be disposed between the end portion bk4 of the bank 116 and the deposition blocking layer 153 in the transmissive area TA. The at least one structure Da is disposed on the planarization layer 115*b* and may be formed of the same material as the planarization layer 115*b*. For example, the structure Da may be integrally formed (i.e., formed in one process) with the planarization layer 115*b* through a photo-process or the like during a process of the planarization layer 115*b*. A height of the structure Da may be formed as a height sufficient to block the deposition blocking layer 153 from reaching the bank 116, and may be lower than a height of the bank 116 and higher than a height of the deposition blocking layer 153. The structure Da may be formed from the same material and/or in the same process as the bank 116 and/or the planarization layer 115*b*. The structure Da may be any shape.

Through this, formation of the deposition blocking layer 153 along the side surface of the bank 116 is effectively prevented, so that an effect of preventing film delamination defects may be improved.

Figure 12A:
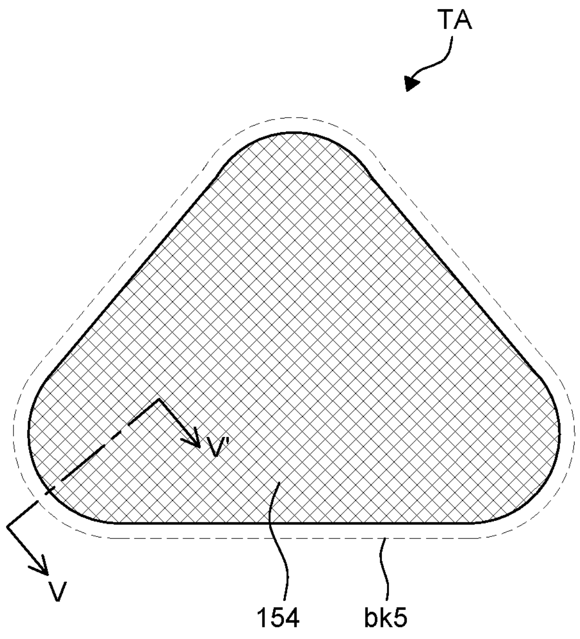
FIG. 12A is a plan view schematically illustrating still another example of a positional relationship between a deposition blocking layer in the transmissive area and an end portion of the bank in the emission area according to an example of the present disclosure.
Figure 12B:
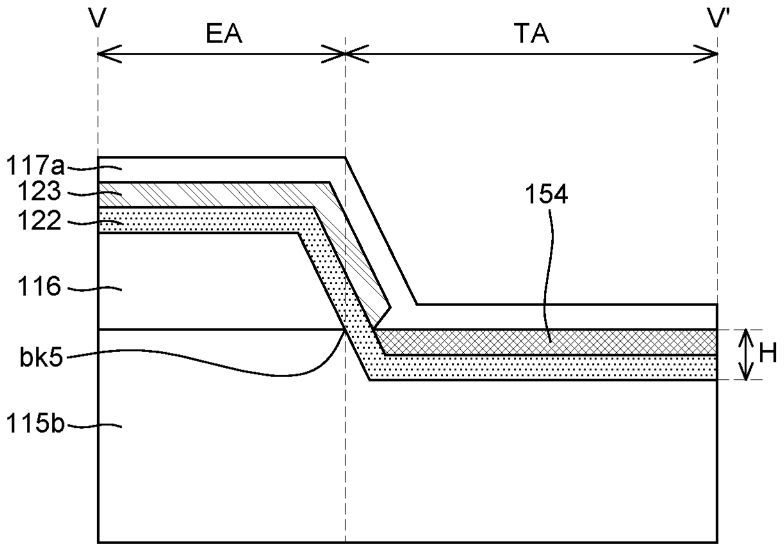
FIG. 12B is an enlarged cross-sectional view of the emission area and the transmissive area taken along V-V' of FIG. 12A, according to an example of the present disclosure.

FIG. 12A is a plan view schematically illustrating still another example of a positional relationship between a deposition blocking layer in the transmissive area and an end portion of the bank in the emission area according to an example of the present disclosure. FIG. 12B is an enlarged cross-sectional view of the emission area and the transmissive area taken along V-V' of FIG. 12A, according to an example of the present disclosure.

Previously, in FIGS. 8A, 9A, 10A, and 11A, it was illustrated that an upper surface of the planarization layer 115*b* in the transmissive area TA is horizontal with an upper surface of the planarization layer 115*b* in the emission area EA. That is, there is no step under the deposition blocking layer 150, and an effect of preventing film delamination due to the arrangement of the deposition blocking layer 150 can be prevented.

Referring to FIGS. 12A and 12B, an end portion bk5 of the bank 116 disposed in the emission area EA and a deposition blocking layer 154 disposed in the transmissive area TA are spaced apart by a predetermined distance, and a height of the upper surface of the planarization layer 115*b* in the emission area EA may be greater than a height of the upper surface of the planarization layer 115*b* in the transmissive area TA. In this case, an upper surface of the deposition blocking layer 154 in the transmissive area TA and an upper surface of the planarization layer 115*b* in the emission area EA may be formed to have the same height.

For example, the planarization layer 115*b* in the transmissive area TA may be formed to be lower than the planarization layer 115*b* in the emission area EA by a predetermined height H. At this time, the height H by which the planarization layer 115*b* has a step in the transmissive area TA compared to the emission area EA may be set so that a height of the deposition blocking layer 154 is formed to be equal to the height of the upper surface of the planarization layer 115*b* in the emission area EA.

Through this, the step of the deposition blocking layer 154 is eliminated in the transmissive area TA while the deposition blocking layer 154 is effectively prevented from being formed along the side surface of the bank 116, so that an effect of preventing film delamination of the deposition blocking layer 154 can be improved.

As described above, FIGS. 8A, 9A, 10A, 11A, and 12A illustrate a structure in which the transmissive area TA has a triangular shape, but the shape of the transmissive area TA according to an example of the present disclosure is not limited thereto. For example, the transmissive area TA may have various shapes such as a circular shape, an elliptical shape, a rectangular shape, a hexagonal shape, or an octagonal shape.

The examples of the present disclosure can also be described as follows:

According to an aspect of the present disclosure, there is provided a display apparatus. The display apparatus includes a substrate including a display area including a first area and a second area surrounding the first area, the first area includes an emission area and a transmissive area. The display apparatus further includes a planarization layer disposed on the substrate in the display area. The display apparatus further includes a plurality of light emitting elements disposed on the planarization layer and including an anode, a light emitting layer, and a cathode. The display apparatus further includes a bank disposed to cover a portion of an end portion of the anode in the emission area. The display apparatus further includes a deposition blocking layer disposed on the planarization layer in the transmissive area. The deposition blocking layer is spaced apart from the bank.

The deposition blocking layer may include a plurality of side portions and a plurality of corner portions connecting the plurality of side portions. A distance between at least one of the plurality of corner portions and an end portion of the bank may be greater than a distance between each of the plurality of side portions and the end portion of the bank.

The cathode may be disposed to extend from the emission area to a portion of the transmissive area. At least one of the plurality of side portions of the deposition blocking layer may be in contact with a side surface of the cathode in the transmissive area.

The deposition blocking layer may include a plurality of side portions and a plurality of corner portions connecting the plurality of side portions. A distance between at least one of the plurality of side portions and an end portion of the bank may be greater than a distance between each of the plurality of corner portions and the end portion of the bank.

The cathode may be disposed to extend from the emission area to a portion of the transmissive area. At least one of the plurality of corner portions of the deposition blocking layer may be in contact with a side surface of the cathode in the transmissive area.

The display apparatus may further includes at least one structure disposed on the planarization layer in the transmissive area and disposed between the bank and the deposition blocking layer.

The structure may be formed of the same material as the planarization layer.

The structure may be integrally formed with the planarization layer.

An upper surface of the planarization layer may be horizontal in the emission area and the transmissive area.

An upper surface of the planarization layer in the emission area may be higher than an upper surface of the planarization layer in the transmissive area. An upper surface of the deposition blocking layer in the transmissive area and the upper surface of the planarization layer in the emission area may have the same height.

The deposition blocking layer and the cathode may not overlap each other.

The display apparatus may further include an optical electronic device disposed below the substrate in the first area.

Although the examples of the present disclosure have been described in detail with reference to the accompanying drawings, the present disclosure is not limited thereto and may be embodied in many different forms without departing from the technical concept of the present disclosure. Therefore, the examples of the present disclosure are provided for illustrative purposes only but not intended to limit the technical concept of the present disclosure. The scope of the technical concept of the present disclosure is not limited thereto. Therefore, it should be understood that the above-described examples are illustrative in all aspects and do not limit the present disclosure. The protective scope of the present disclosure should be construed based on the following claims, and all the technical concepts in the equivalent scope thereof should be construed as falling within the scope of the present

What is claimed is:

1. A display apparatus, comprising:

a substrate including a display area, the display area including a first area and a second area surrounding the first area, and the first area includes an emission area and a transmissive area;

a planarization layer disposed on the substrate in the display area;

a plurality of light emitting elements that are disposed on the planarization layer, the plurality of light emitting elements including an anode, a light emitting layer, and a cathode;

a bank disposed to cover a portion of an end portion of the anode in the emission area;

a deposition blocking layer disposed on the planarization layer in the transmissive area; and an encapsulation layer disposed over the plurality of light emitting elements and the deposition blocking layer, the encapsulation layer including a first inorganic encapsulation layer, an organic encapsulation layer, and a second inorganic encapsulation layer, wherein the deposition blocking layer is spaced apart from the bank.

2. The display apparatus of claim 1, wherein the deposition blocking layer includes a plurality of side portions and a plurality of corner portions that connect the plurality of side portions, wherein a distance between at least one of the plurality of corner portions and an end portion of the bank is greater than a distance between each of the plurality of side portions and the end portion of the bank.

3. The display apparatus of claim 2, wherein the cathode is disposed to extend from the emission area to a portion of the transmissive area, and at least one of the plurality of side portions of the deposition blocking layer is in contact with a side surface of the cathode in the transmissive area.

4. The display apparatus of claim 1, wherein the deposition blocking layer includes a plurality of side portions and a plurality of corner portions that connects the plurality of side portions, wherein a distance between at least one of the plurality of side portions and an end portion of the bank is greater than a distance between each of the plurality of corner portions and the end portion of the bank.

5. The display apparatus of claim 4, wherein the cathode is disposed to extend from the emission area to a portion of the transmissive area, and at least one of the plurality of corner portions of the deposition blocking layer is in contact with a side surface of the cathode in the transmissive area.

6. The display apparatus of claim 1, further comprising:

at least one structure disposed on the planarization layer in the transmissive area and disposed between the bank and the deposition blocking layer.

7. The display apparatus of claim 6, wherein the at least one structure is configured to be formed of a same material as the planarization layer.

8. The display apparatus of claim 6, wherein the at least one structure is configured to be integrally formed with the planarization layer.

9. The display apparatus of claim 1, wherein an upper surface of the planarization layer is horizontal in the emission area and the transmissive area.

10. The display apparatus of claim 1, wherein an upper surface of the planarization layer in the emission area has a greater height than an upper surface of the planarization layer in the transmissive area, and an upper surface of the deposition blocking layer in the transmissive area and the upper surface of the planarization layer in the emission area have a same height.

11. The display apparatus of claim 1, wherein the deposition blocking layer and the cathode do not overlap each other.

12. The display apparatus of claim 1, further comprising:

an optical electronic device disposed below the substrate in the first area.

13. The display apparatus of claim 1, wherein the deposition blocking layer has an area of less than 95% of the area of the transmissive area.

14. The display apparatus of claim 1, wherein the deposition blocking layer is not disposed along a side surface of the bank.

15. The display apparatus of claim 1, wherein the cathode is not disposed in the transmissive area.

* * * * *